US012687714B2

(12) United States Patent
Sanford et al.

(10) Patent No.: US 12,687,714 B2
(45) Date of Patent: Jul. 21, 2026

(54) TWO-LAYER OPTICAL BEAM STEERING DEVICE, SYSTEM, METHOD OF UTILIZATION, AND METHOD OF FABRICATION

(71) Applicant: Carillon Technologies Management Corporation, Arlington, VA (US)

(72) Inventors: John R. Sanford, Escondido, CA (US); John D. Evans, Arlington, VA (US)

(73) Assignee: Carillon Technologies Management Corporation, New Haven, CT (US)

( * ) Notice: Subject to any disclaimer, the term of this patent is extended or adjusted under 35 U.S.C. 154(b) by 477 days.

(21) Appl. No.: 18/037,377

(22) PCT Filed: Nov. 17, 2021

(86) PCT No.: PCT/US2021/059708
§ 371 (c)(1),
(2) Date: May 17, 2023

(87) PCT Pub. No.: WO2022/139986
PCT Pub. Date: Jun. 30, 2022

(65) Prior Publication Data
US 2023/0418049 A1     Dec. 28, 2023

Related U.S. Application Data

(60) Provisional application No. 63/132,217, filed on Dec. 30, 2020, provisional application No. 63/114,728, filed on Nov. 17, 2020.

(51) Int. Cl.
*G02B 26/10* (2006.01)
*G02F 1/29* (2006.01)
(Continued)

(52) U.S. Cl.
CPC ............ *G02B 26/101* (2013.01); *G02F 1/29* (2013.01); *B81B 2201/047* (2013.01);
(Continued)

(58) Field of Classification Search
None
See application file for complete search history.

(56) References Cited

U.S. PATENT DOCUMENTS

2016/0274437 A1    9/2016  Russo et al.
2018/0136538 A1*   5/2018  Khan ..................... G02F 1/292
(Continued)

FOREIGN PATENT DOCUMENTS

KR    10 2020/0128178 A    11/2020
WO    WO-2022/139986 A2    6/2022
WO    WO-2022/139986 A3    9/2022

OTHER PUBLICATIONS

International Search Report and Written Opinion for International Application No. PCT/US2021/059708 dated Aug. 29, 2022.

*Primary Examiner* — Dung T Nguyen
(74) *Attorney, Agent, or Firm* — Bryan Wilson IP Law, PLLC

(57) ABSTRACT

A two-layer optical beam steering device, system, method of utilization and method of fabrication are disclosed. The solid-state device enables beam steering in two dimensions with dramatically fewer control lines than prior devices. This renders the device more technically realizable, easier to control, and more affordable to manufacture. Because less data need be transferred to the device, the device is also able to operate at faster speeds.

24 Claims, 46 Drawing Sheets

(51) Int. Cl.
  *B81C 1/00*              (2006.01)
  *G01S 7/481*             (2006.01)
(52) U.S. Cl.
  CPC ...  *B81B 2203/0361* (2013.01); *B81B 2203/04*
        (2013.01); *B81C 1/00166* (2013.01); *G01S*
                                *7/4817* (2013.01)

(56)                References Cited

U.S. PATENT DOCUMENTS

| | | |
|---|---|---|
| 2018/0136539 A1 | 5/2018 | Kim et al. |
| 2019/0025573 A1 | 1/2019 | Aleksov et al. |
| 2019/0044251 A1 | 2/2019 | McMorrow et al. |

* cited by examiner

Bottom Layer Phase Control Performance

Reflectivity

Scanned to (θ=45, φ=−45)

Scanned to (θ=30, φ=90)

Scanned to (θ=0, φ=0)

Potential Architectures

Potential Architectures

Silicon Wafer
Photoresist
Nitride
TEOS
Copper
TaN
Ti/TiN/Al/TiW
BARc

SiN Dep
TEOS Dep
Pattern 82
84
86
80

⊠ Silicon Wafer
⊠ Photoresist
■ Nitride
▨ TEOS
▨ Copper
■ TaN
▨ Ti/TiN/Al/TiW
▨ BARc TEOS Etch Strip
TaN/Cu deposition
Cu Plating
Cu CMP ⊠ Silicon Wafer
⊠ Photoresist
■ Nitride
■ TEOS
⊠ Copper
■ TaN
□ Ti/TiN/Al/TiW
⊠ BARc SiN / TEOS / SiN Dep.
TEOS Dep
Pattern Silicon Wafer
Photoresist
Nitride
TEOS
Copper
TaN
Ti/TiN/Al/TiW
BARc TEOS / SiN / TEOS Etch
BARc Dep Silicon Wafer
Photoresist
Nitride
TEOS
Copper
TaN
Ti/TiN/Al/TiW
BARc TEOS Etch Silicon Wafer Photoresist Nitride

TEOS

Copper

TaN

Ti/TiN/Al/TiW

BARc

SiN Etch

Strip

Silicon Wafer
Photoresist
Nitride
TEOS
Copper
TaN
Ti/TiN/Al/TiW
BARc

TiN/Cu Dep
Cu plate, Cu CMP

Strip
Pattern

Silicon Wafer
Photoresist
Nitride
TEOS
Copper
TaN
Ti/TiN/Al/TiW
BARc

130

SiN Dep
Pattern

Silicon Wafer
Photoresist
Nitride
TEOS
Copper
TaN
Ti/TiN/Al/TiW
BARc

140

142

SiN / TEOS / SiN / TEOS Etch

Silicon Wafer
Photoresist
Nitride
TEOS
Copper
TaN
Ti/TiN/Al/TiW

Wire Bonding

198

TWO-LAYER OPTICAL BEAM STEERING DEVICE, SYSTEM, METHOD OF UTILIZATION, AND METHOD OF FABRICATION

CROSS REFERENCE TO RELATED APPLICATIONS

This application is the U.S. National Stage of International Application No. PCT/US2021/059708, filed Nov. 17, 2021, which designates the U.S., published in English, and claims the benefit of U.S. Provisional Application No. 63/132,217, filed on Dec. 30, 2020 and U.S. Provisional Application No. 63/114,728, filed on Nov. 17, 2020. The entire teachings of the above applications are incorporated herein by reference.

BACKGROUND

The technology relates to the general field of optical beam steering systems for applications such as optical communication, imaging, LIDAR, and directed energy.

BRIEF SUMMARY OF THE DISCLOSURE

Recent advancements in both microfabrication techniques and metamaterials technology have enabled a range of strategies for controlling the structure, direction, and illumination pattern of light. For example, U.S. Pat. No. 9,841,544B2 describes a device comprising a one-dimensional array of liquid crystal optical elements. The elements comprise a strip of liquid crystal material, and 'bar' electrodes on each side of the liquid crystal material. In this case the elements comprise optically resonant cavities. This device is driven by a number, n, control lines, and is capable of scanning a beam of light in one dimension. The spacing between the electrodes is a fraction (say one-third to two-thirds) a wavelength of light. Light with a wavelength of 0.9 um to 1.55 um is commonly used. The size of the device is determined by the optical beam width required for the application, with larger devices producing narrower beams. The number of control lines is determined by the degree of scanning control (step size) required by the application. In common applications, the optical device can be 0.1-10 centimeters across (e.g. $1\times10^6$ um to $1\times10^8$ um), and thus feature on the order of $10^8$ optical elements. Depending on the application, these can be driven by as few as several hundred control lines. In other applications it is desirable to have independent control over each optical resonator, requiring on the order of $10^8$ independent control lines.

U.S. Ser. No. 10/622,393B2 describes a two-dimensional array of liquid crystal elements (again optical resonators), driven by a two-dimensional array of electrode 'columns'. This device is driven by a number, m×n, control lines (or $n^2$ control lines, where m=n), and is capable of scanning in two dimensions. Two dimensional devices can also be from 0.1-10 cm across. This results in as many as $10^{16}$ resonators, each potentially requiring individual control. Providing this number of independent control lines can be unachievable, and in any event, unaffordable. The difficulty is compounded by the small scale of the resonators. Resonators are often fabricated on one-third to two-thirds wavelength centers and thus are often around 300 nm to 1000 nm in lateral dimension. As a general rule, control lines are often 100 nm across. Thus, it can be impractical to route this number of control lines within the space available. As an alternate to routing individual control lines, local drive circuitry could be used to compute the needed control signal to each resonator. However, this it is challenging to realize the required circuitry in the 300 nm×300 nm to 1000 nm×1000 nm available area.

Various embodiments disclosed herein achieve two-dimensional scanning with dramatically fewer control lines using a strategy that allows for ready routing of control lines in two dimensions. This renders the device more technically realizable, easier to control, and more affordable to manufacture. Because less data need be transferred to the device, the device is also able to operate at faster speeds.

An exemplary device in accordance with one or more embodiments comprises a two-dimensional array of elements spaced on the order of one-third to two-thirds wavelength centers. Each resonator actually comprises two independently controllable cavities, one on top of the other. In one embodiment, the upper-level cavities are actuated in order to achieve scanning in one axis. Independently, the lower-level cavities are actuated to achieve actuation in a second (for example, orthogonal) axis. The final direction of beam steering is a function (e.g., a superposition) of the commanded directions in the two axes. The cavities may be optically resonant, as in the prior examples, or may be non-resonant cavities that generate a phase delay in the light as it transits the cavity.

Using this approach, control signals for the upper cavity can be routed across the device in one axis. On a second (e.g., lower) level, control signal for the lower cavities can be routed across the chip in a second (e.g. orthogonal) direction. This approach enables creation of a scanning device able to scan in two dimensions, but which utilized 2n control lines (with n fed in one axis and n fed in a second axis), rather than $n^2$ control signals. While this is a quantitative difference, given that n is often on the order of $10^8$, this represents a significant qualitative improvement in the one's ability to design and manufacture the devices at all, and at an affordable price.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein:

FIG. 5 shows a cross section of the configuration in the E-plane of the incident electromagnetic energy 42. The E-plane is defined as the plane that contains both the direction of the electric field vector and the direction of propagation. The incident plane wave 42, arriving from direction $k_i$, impinges on the device. The dimensions are chosen such that the electromagnetic energy propagates into the device and is bound by upper-layer electrodes 38 and the lower-layer electrodes 40. Voltages are applied to each of the various upper-level electrodes 38 and lower-layer electrodes 40 in so that the upper-level optical cavities 35 and lower-level optical cavities 36 each induce a desired phase and amplitude shift on the electromagnetic energy. The optical cavities then reemit their light. Through coherent recombination of the reemitted light from the optical cavities, a desired emission pattern is generated, such as a beam of light in a desired direction 44.

As shown in FIG. 1, FIG. 2, and FIG. 3, the lower-level electrodes 36 are configured so that the potential difference across each of the lower-level optical cavities 36 are the same in each E-plane. Therefore, the electric field is the same, and the properties of the liquid crystal is the same, across the lower-level optical cavities 36 in each E-plane.

FIG. 7 is a cross-sectional view depicting operation of an exemplary beam steering device in accordance with one or more embodiments. The illustration includes multiple two-layer optical elements 32. While FIG. 5 and FIG. 6 depict the E-Plane, FIG. 7 depicts the H-plane. The H-plane is defined as the plane that contains both the direction of the magnetic field vector and the direction of propagation of the incident electromagnetic energy 42. The H-plane is perpendicular to the E-plane. The incident plane wave 42, arriving from direction $k_i$, impinges on the two-layer optical elements 32. The optical elements 32 comprise upper-layer optical cavities 35 and lower-level optical cavities 36. The electromagnetic energy is captured and directed into the optical elements 32 by upper-layer electrodes bounding on at least two sides the upper-layer optical cavity 35 and lower-layer electrodes bounding on at least two sides the lower-layer optical cavities 36 as previously described in FIG. 5 and FIG. 6. These electrodes run parallel to the H-Plane, behind and in front of the optical cavities 35 and 36, and are thus not visible in this depiction. The upper-level electrodes bounding the upper-level optical cavities 35 comprise metal bars (or rails) running across (but behind and in front of) the image. The lower-level electrodes bounding the lower-level optical cavities 36 comprise a series of electrodes, each electrode bounding two lower-level optical cavities 36, with behind-plane and in-front-of-plane electrodes offset from each other, as described in FIG. 1. The upper-level and lower-level optical cavities 35 and 36 are filled with a material whose electromagnetic properties can be controlled, for example, through application of electric fields. In this embodiment, the material is a liquid crystal material. Application of electric potentials on the upper-level and lower-level electrodes bounding the upper-level and lower-level optical cavities 35 and 36 generates electric fields in the upper-level and lower-level optical cavities 35 and 36. By controlling the potentials applied to the upper-level and lower-level electrodes, the electromagnetic properties of the material in the upper-level and lower-level optical cavities 35 and 36 are controlled. As a result of the interaction with the material in the optical cavities, as described in FIG. 6, the re-emitted energy from each element 32 experiences a controllable change in amplitude and phase relative to the incident electromagnetic energy 42. Through prudent selection of the voltage biases for each of the upper-level and lower-level electrodes, the coherent recombination of the energy reemitted from each of the elements 32 forms a desired electromagnetic pattern, such as a beam of electromagnetic energy 44 emitted in a desired direction $k_r$. Because each of the upper-level optical cavities 35 are bound by common 'bar' electrodes that are at the same potential, the electric field in each of the upper-level optical cavities in each H-plane will be the same. Therefore, the properties of the liquid crystal material in the upper-level optical cavities 35 will be the same across each H-plane.

Figure 1:
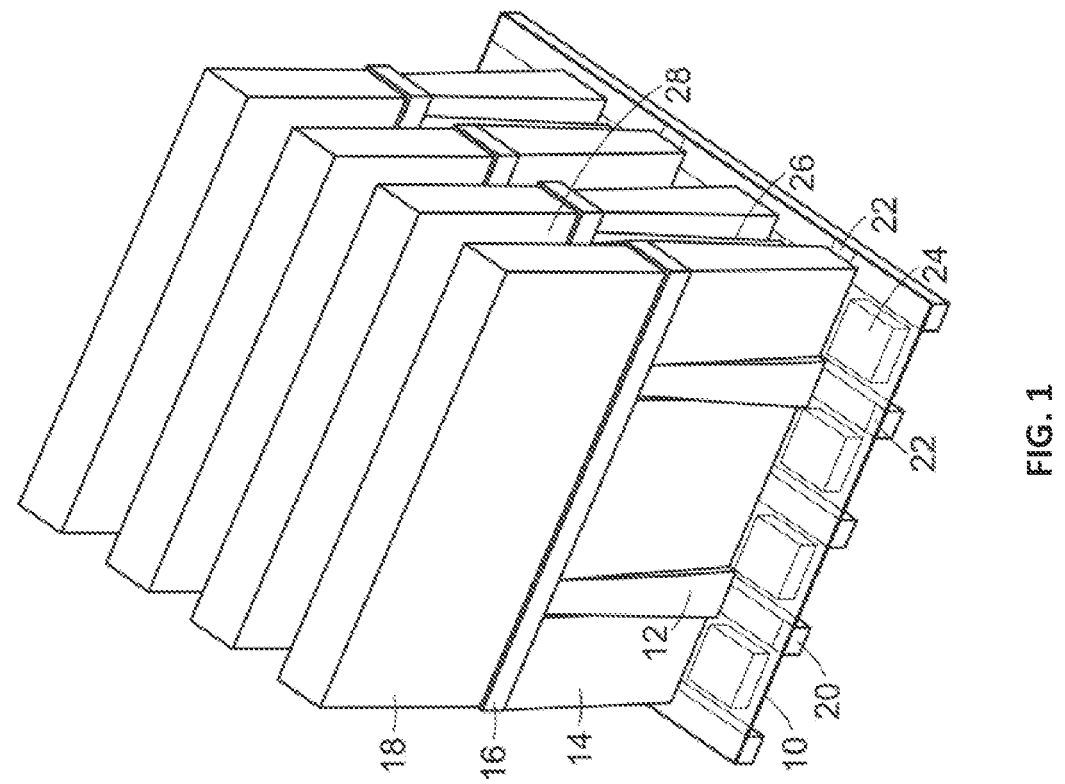
FIG. 1 illustrates a portion of an exemplary two-dimensional beam steering chip in accordance with one or more embodiments. The chip comprises a two-dimensional array of two-layer optical cavities. In this embodiment, a silicon oxide (or simply 'oxide') base layer 10 supports oxide separators 12 that isolate rows of first-layer copper electrodes 14. Each first-layer copper electrode 14 is used by two optical cavities. Each row of first-layer copper electrodes is offset from the next row in an alternating manner. The first layer copper electrodes are electrically isolated from the second layer copper electrodes by oxide and nitride layers, collectively 16. The second-layer copper electrodes comprise a series of copper bars 18 that are controlled by electrical interconnects at the edge of the device (not shown). The first layer electrodes are controlled by a copper interconnect layer. The interconnect layer comprises a series of copper conductors 20. The copper bars 20 are connected to the first layer electrodes 14 through vias 22, at least one for each electrode, that penetrate the oxide base layer 10. The copper control layer may also optionally contain reflectors 24. In some designs, the copper bars 20 serve as reflectors. Each two-layer optical element comprises an optional reflector 24, a first-layer cavity 26 containing liquid crystal material, and a second-layer cavity 28 also containing liquid crystal material. As discussed below, the entire device is coated with a nitride layer (not shown) to electrically isolate the electrodes 14 and 18 from the liquid crystal material.

In a first mode of operation, the device 60 is configured to redirect the beam 66, forming beam 68, such that beam 68 impinges upon a target location 70. In this mode, if the substrate 62 rotates and the laser 64 rotates with the substrate 62, then the action of rotating the substrate 62 adjusts the axial direction of the beam 68, independent of the setting of the device 60. If the laser 60 does not rotate with the substrate 62, then rotation of substrate 62 also adjusts the axial direction of the beam 68, although the polarization experienced at device 60 will change as substrate 62 is rotated, generating secondary effects.

In this first mode of operation, adjusting the position of the laser 64 adjusts the angle of incidence of beam 66 onto the device 60. As device 60 is commonly configured to generate a constant change in angle between beam 66 and beam 68, adjusting the angle of the laser 64 has the effect of adjusting the angle of beam 68. Optionally, the setting of device 60 can be used as a coarse adjustment of the direction of beam 68, and the positioning of laser 64 can be used as a fine adjustment of the direction of beam 68.

In a second mode of operation, the device 60 is configured to split the beam 66 into at least two beams, for example 68 and 72, such that the at least two beams 68 and 72 impinge on at least two targets, such as 70 and 74. In this second mode, if the substrate 62 rotates and the laser 64 rotates with the substrate 62, then the action of rotating substrate 62 adjusts the axial direction of the at least two beams 68 and 72, independent of the setting of the device 60. If the laser 60 does not rotate with the substrate 62, then rotation of substrate 62 also adjusts the axial direction of the at least two beams 68 and 72, although the polarization experienced at device 60 will change as substrate 62 is rotated, generating secondary effects.

In this second mode of operation, adjusting the position of the laser 64 adjusts the angle of incidence of beam 66 onto the device 60, and therefore the angle of the at least two beams 68 and 72. Optionally, the setting of device 60 can be used as a coarse adjustment of the direction of at least two beams 68 and 72, and the position of laser 64 can be used as a fine adjustment of the direction of the at least two beams 68 and 72.

Figure 12:
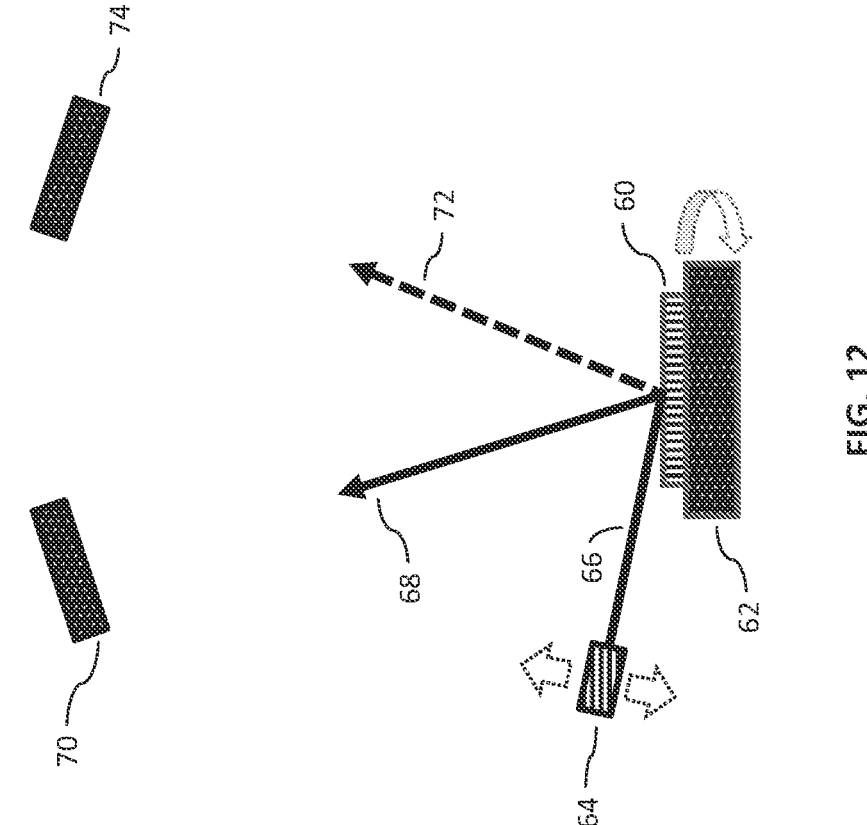
FIG. 12 illustrates a system using an exemplary device in accordance with one or more embodiments. The device 60 is mounted on a substrate 62. Optionally, the substrate 62 can comprise a rotating stage. A laser 64 is mounted to project a laser beam 66 onto to the device 60. The laser 64 may include a beam-spreading lens. The laser 64 may include a lens designed to generate a flat wave front. The angle of incidence of the laser beam 66 upon the device 60 can optionally be a shallow angle. The laser 64 can be mounted on the substrate 62 or mounted separate from the substrate 62. If mounted on the substrate 62, and if substrate 62 comprises a rotating stage, then the laser 64 will rotate with the substrate 62, and therefore with the device 60. The laser 64 is optionally mounted on actuators to enable movement of the laser, thereby adjusting the angle at which the laser beam 66 impinges on the device 60.
Figure 13:
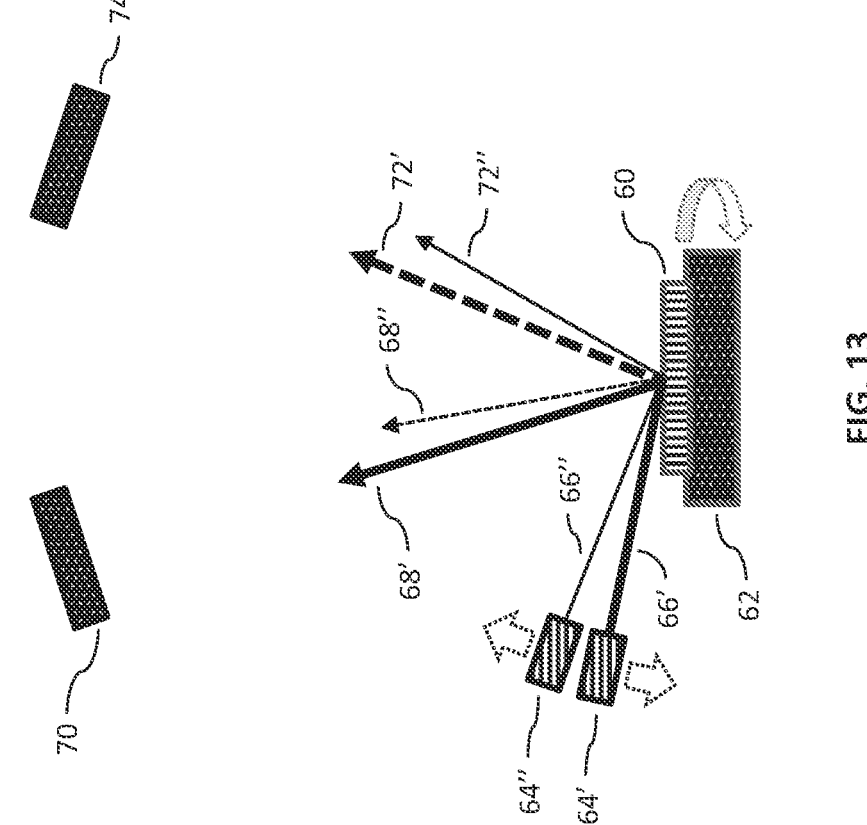

FIG. 13 illustrates an alternate system using an exemplary device in accordance with one or more embodiments. This system is similar to the system of FIG. 12, except this system comprises at least two lasers, for example 64' and 64". Each of the at least two lasers, 64' and 64" can optionally be mounted on actuators. The at least two lasers 64' and 64" each generate an at least two laser beams 66' and 66" that impinge upon the device 60.

In a first mode of operation, the device 60 is configured to redirect the at least two beams 66' and 66" to form at least two beams 68' and 68". The system may be designed so that each of the at least two beams 68' and 68" impinge on targets, such as 70. In this depiction, the system is configured such that beam 68' impinges on target 70, and beam 68" is lost to space.

In a second mode of operation, the device 60 is configured to split the beam 66' and 66" each into at least two beams, for example 68' and 68" and 72' and 72". In this second mode of operation, the position of laser 64' and 64", along with the configuration of device 60 are all arranged so that one beam 68' from laser 64' impinges on target 70, while one beam 72" from laser 64" impinges on target 74. In this configuration, beams 68" and 72' are lost to space. In this mode of operation, device 60 can provide coarse control over the direction of beams 68' and 72", and the positions of lasers 64' and 64" can provide fine control over the directions of beams 68' and 72".

Figure 14:
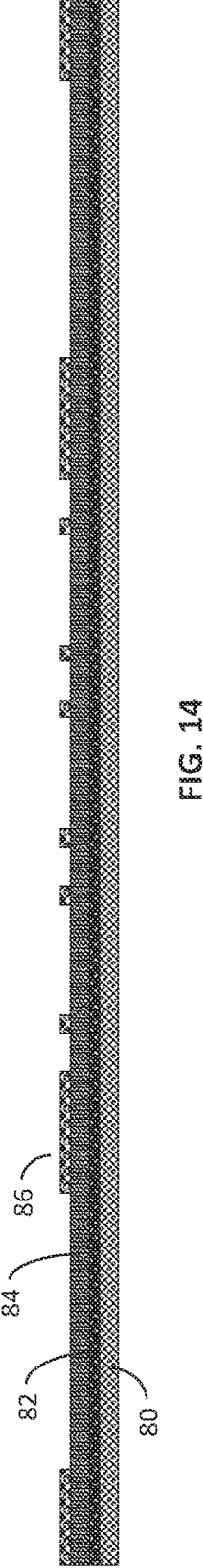

FIG. 14 illustrates the initial steps in an exemplary fabrication process in accordance with one or more embodiments used to fabricate the disclosed device. The process incorporates some fabrications steps commonly used in copper damascene processing. Those skilled in the art will appreciate that incidental steps, such as routine wafer cleaning, are not described in the interest of compactness. The device is fabricated upon a silicon wafer 80 that may or may not contain circuitry. The device being fabricated is isolated from wafer 80 by a nitride layer 82. The first damascene oxide layer 84 is then deposited. Photoresist 86 is then applied and patterned.

Figure 15:

FIG. 15 illustrates subsequent steps in the disclosed fabrication processes. The first damascene oxide layer 84 is etched down to the nitride layer 82 using the photoresist pattern 86 using techniques known to those practiced in the art.

Figure 16:
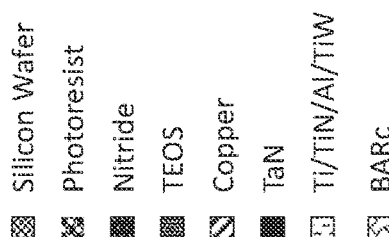
Figure 16:
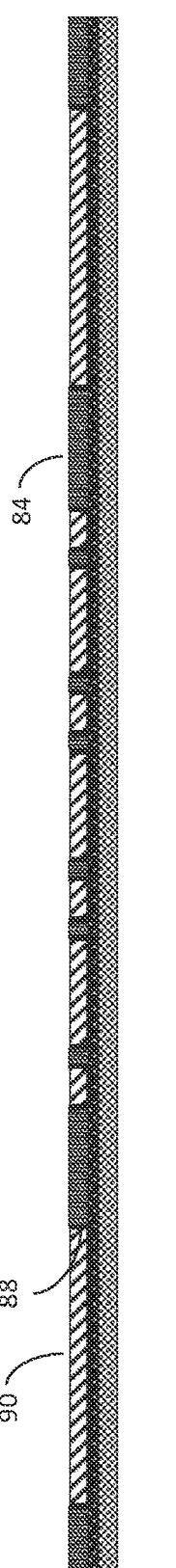

FIG. 16 illustrates subsequent steps in the disclosed fabrication processes. The photoresist layer from FIG. 15 is stripped. The first copper damascene layer is applied and patterned. To achieve this, a seed layer 88, such as Tantalum Nitride, is then deposited over the entire wafer. An additional seed layer of copper may be applied. Then electroplating is used to deposit a copper layer 90 over the entire wafer. The seed layer and copper layer are then polished back stopping on the oxide layer 84, using techniques known to those practiced in the art.

Figure 17:
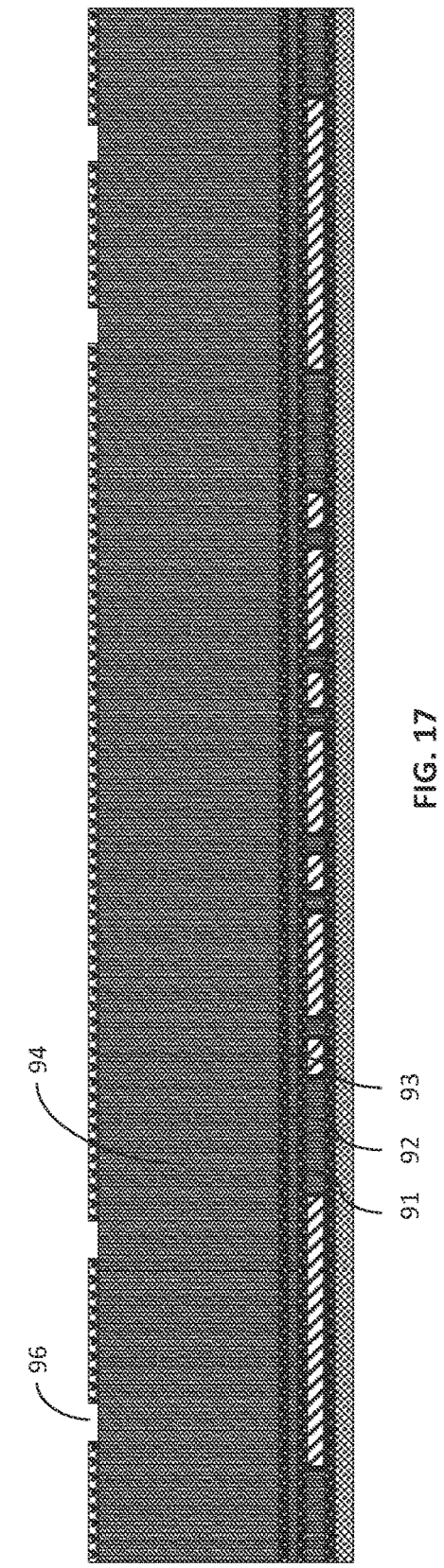

FIG. 17 illustrates subsequent steps in the disclosed fabrication processes. A stack of layers comprising a nitride layer 91, an oxide layer 92, and a nitride layer 93 is deposited on the wafer. Then a thick damascene oxide layer 94 is deposited. A photoresist layer 96 is applied and patterned using the pattern for vias between the first and second damascene layers.

Figure 18:
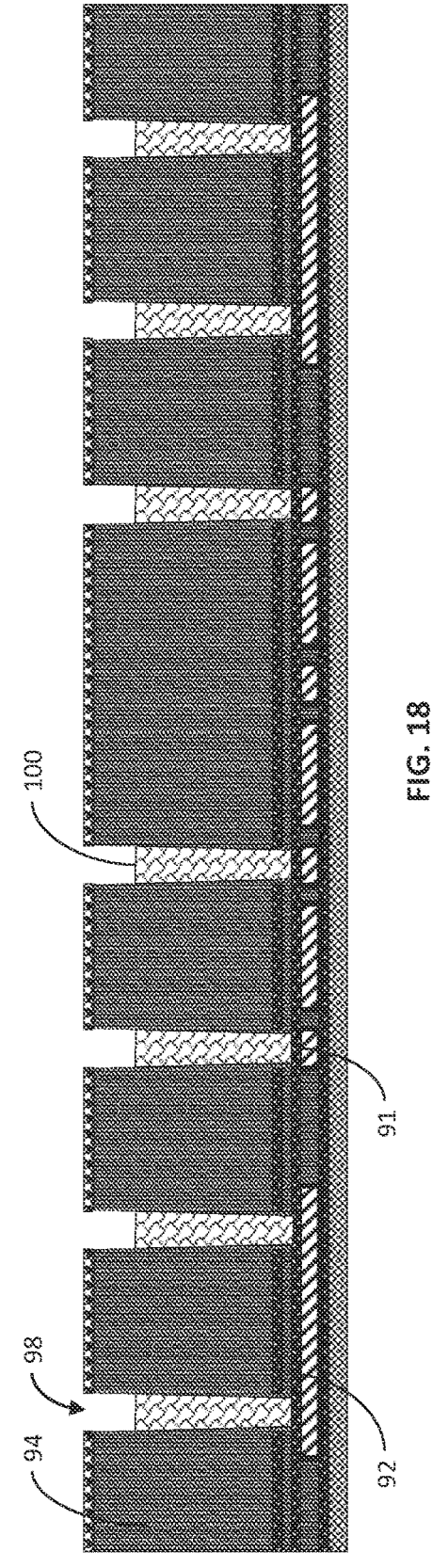

FIG. 18 illustrates subsequent steps in the disclosed fabrication processes. Via holes 98 are etched. This etch penetrates the second damascene oxide layer 94 and the nitride layer 93 and the oxide layer 92, stopping on the lower nitride layer 91, using techniques known to those practiced in the art. The etch holes are then partially filled with a material 100, such as BARc, to protect the lower nitride layer 91.

Figure 19:
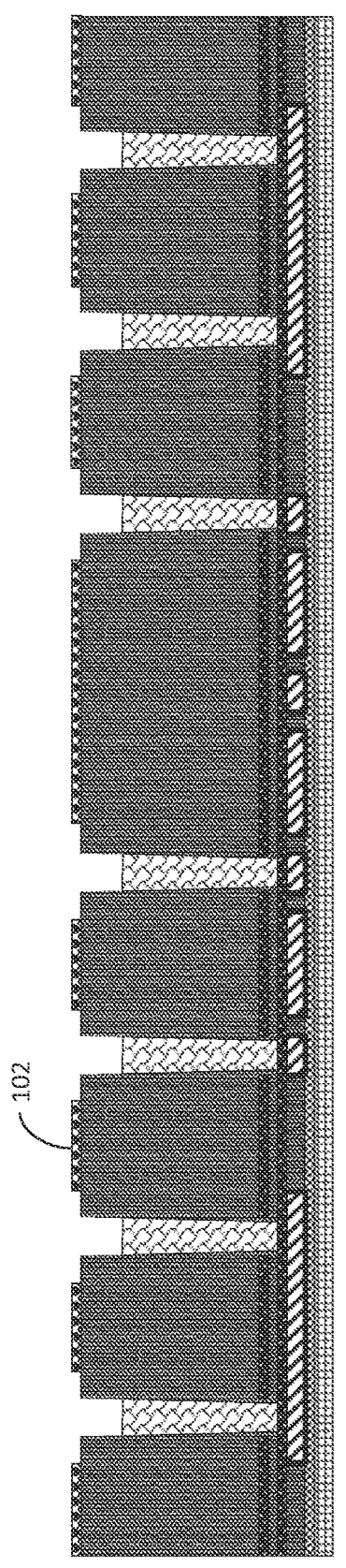

FIG. 19 illustrates subsequent steps in the disclosed fabrication processes. The photoresist layer from FIG. 18 is stripped. A new photoresist layer 102 is applied and patterned with the pattern for the second copper damascene layer.

Figure 20:
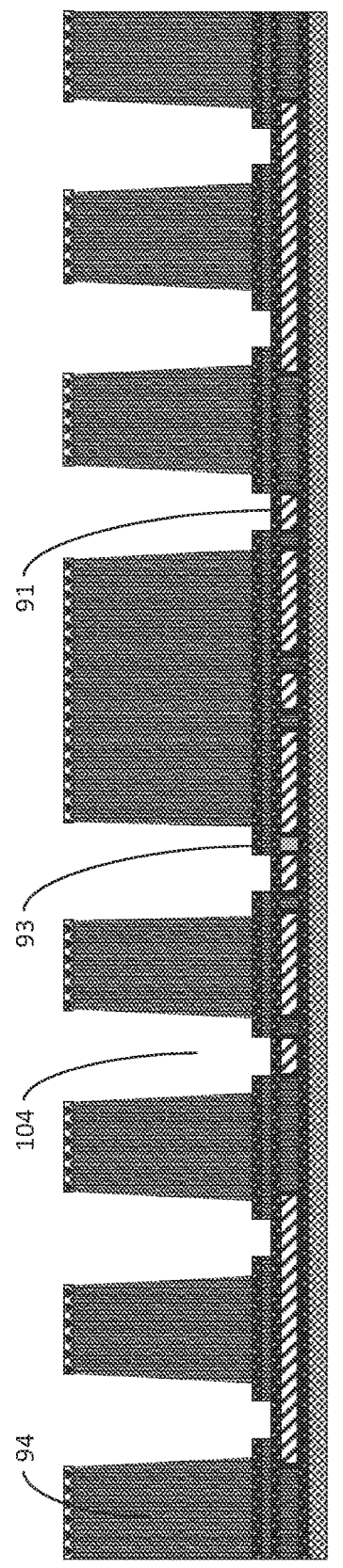

FIG. 20 illustrates subsequent steps in the disclosed fabrication processes. The second damascene oxide layer 94 is etched to form recesses 104. This etch stops on the upper thin nitride layer 93 and the lower thin nitride layer 91.

Figure 21:
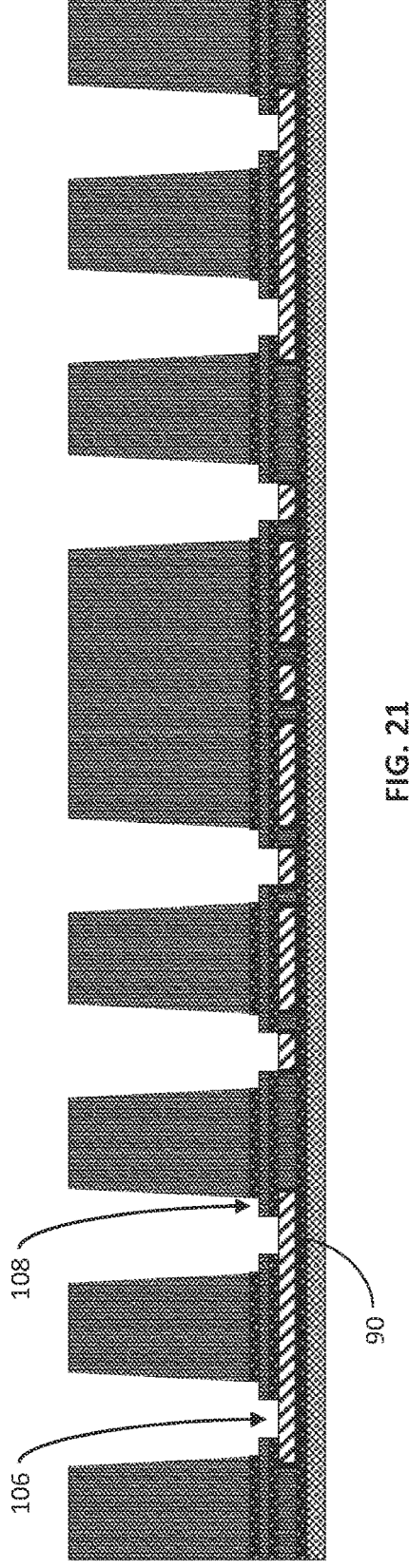

FIG. 21 illustrates subsequent steps in the disclosed fabrication processes. The photoresist layer from FIG. 20 is stripped. A nitride etch is then performed. This removes nitride in the vias 106, revealing the lower copper damascene layer 90. Nitride from the 'shelf' area 108 is also removed, revealing the think oxide layer.

Figure 22:
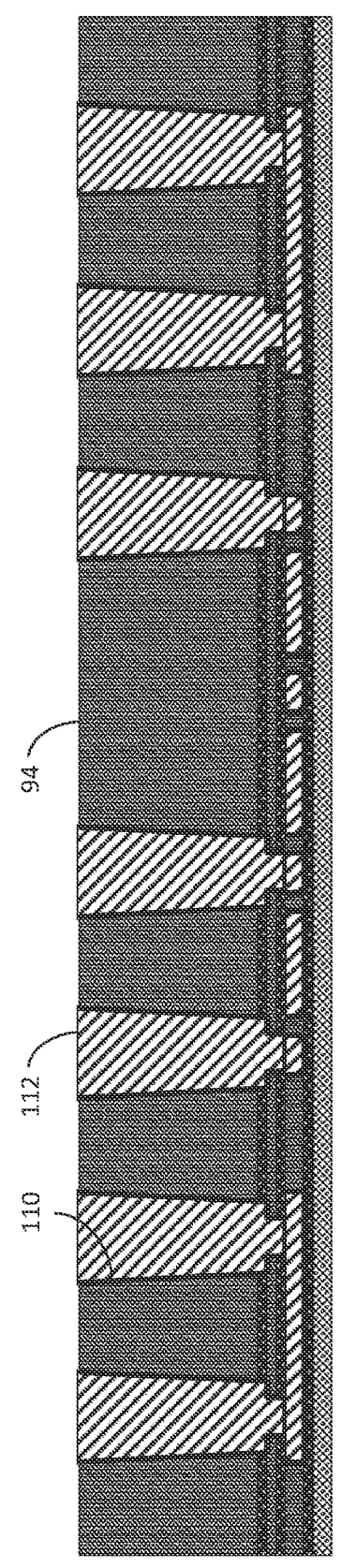

FIG. 22 illustrates subsequent steps in the disclosed fabrication processes. The second copper damascene layer is applied and patterned. To accomplish this, a seed layer 110, such as Tantalum Nitride, is deposited over the entire wafer. Electroplating is then used to deposit a copper layer 112 over the entire wafer. The seed layer and copper layer are then polished back stopping on the oxide layer 94, using techniques known to those practiced in the art.

Figure 23:
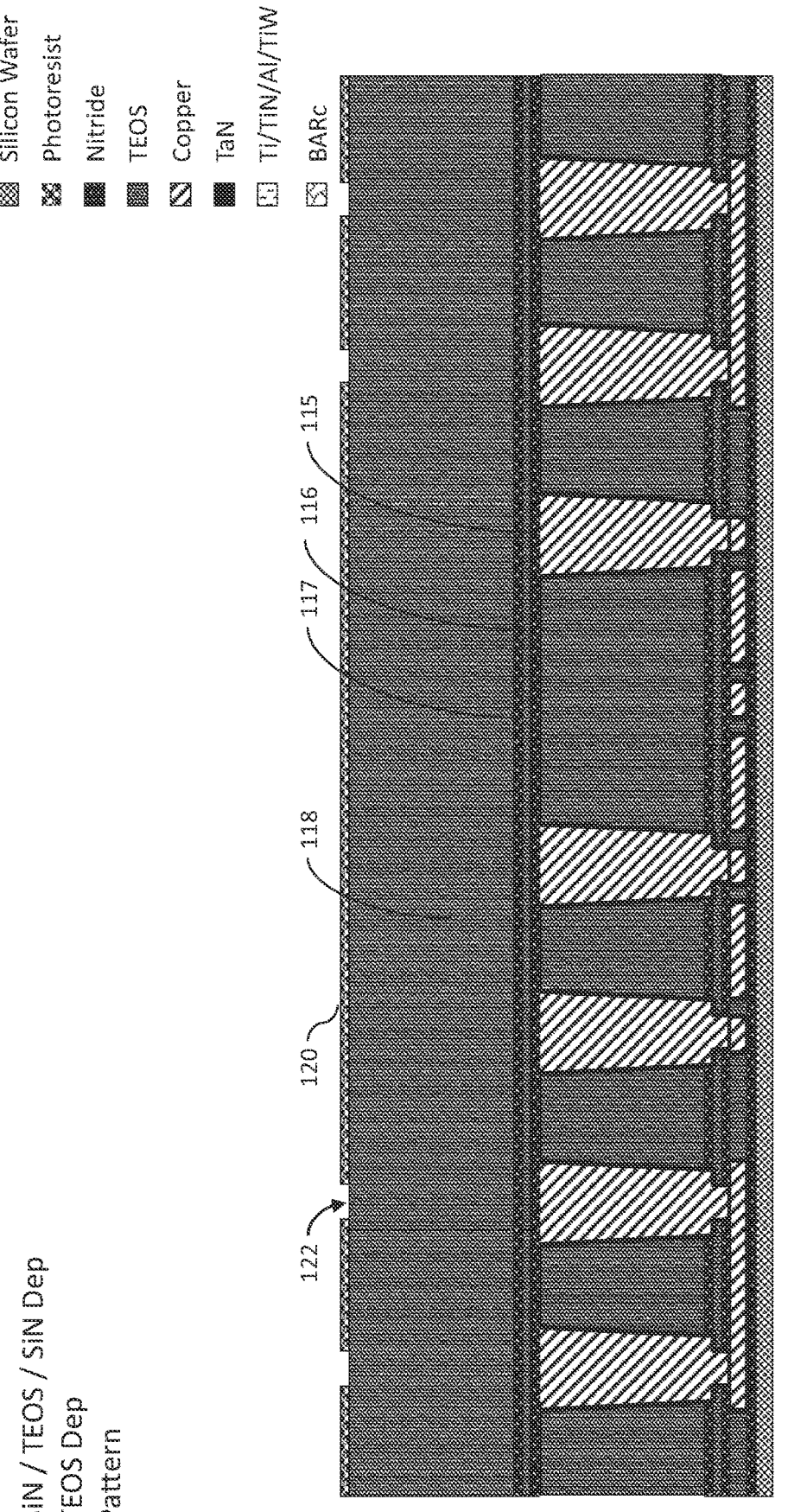

FIG. 23 illustrates subsequent steps in the disclosed fabrication processes. A stack of layers comprising a nitride layer 115, an oxide layer 116, and a nitride layer 117 are deposited on the wafer. A thick damascene oxide layer 118 is then deposited. A photoresist layer 120 is applied and patterned 122 using a pattern for vias between the second and third damascene layers.

Figure 24:
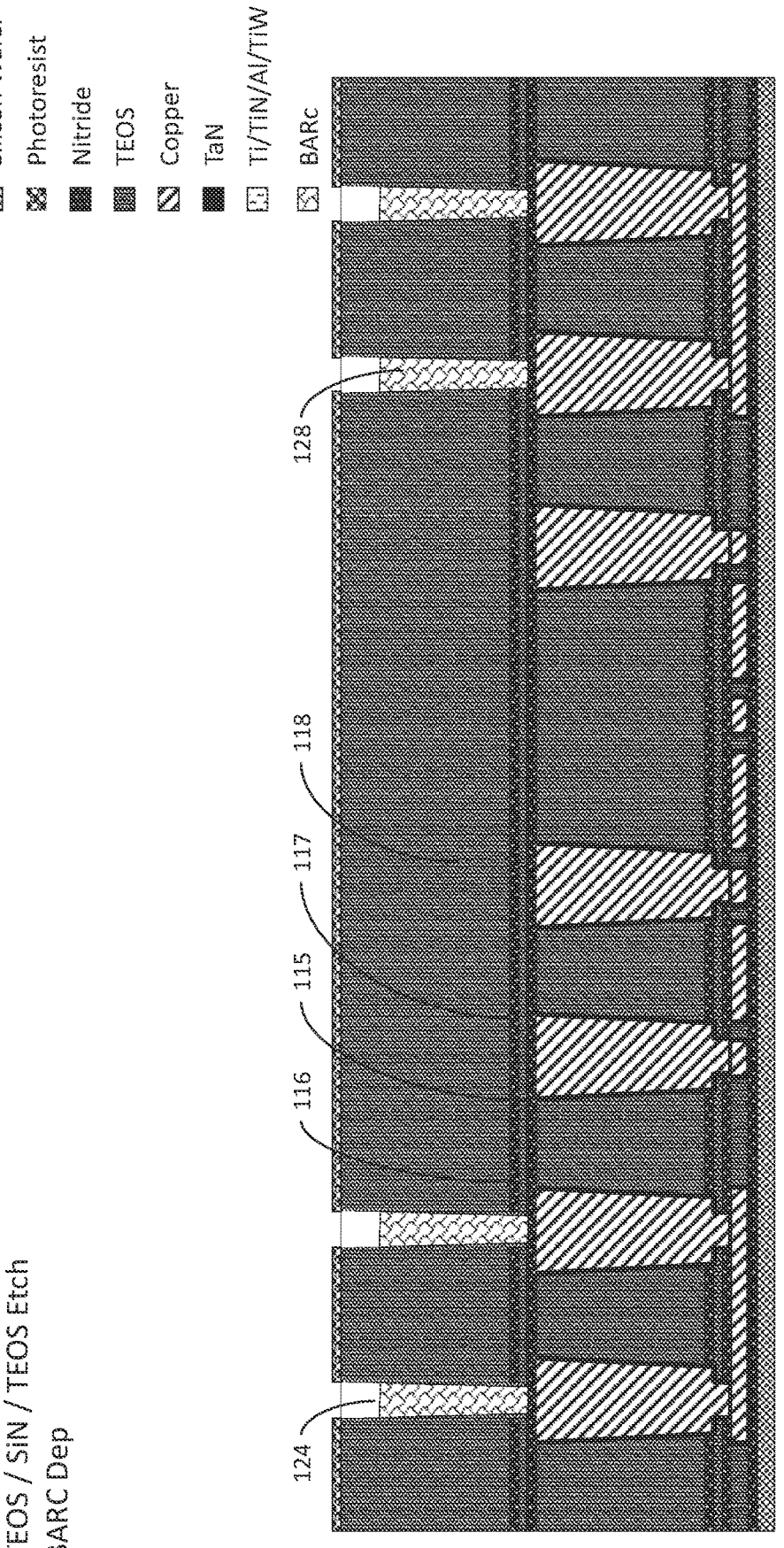

FIG. 24 illustrates subsequent steps in the disclosed fabrication processes. Via holes 124 are etched. This etch penetrates the third damascene oxide layer 118 and the thin nitride layer 117 and oxide layer 116, stopping on the lower nitride layer 115, using techniques known to those practiced in the art. The etch holes are then partially filled with a material 128, such as BARc, to protect the lower nitride layer 115.

Figure 25:
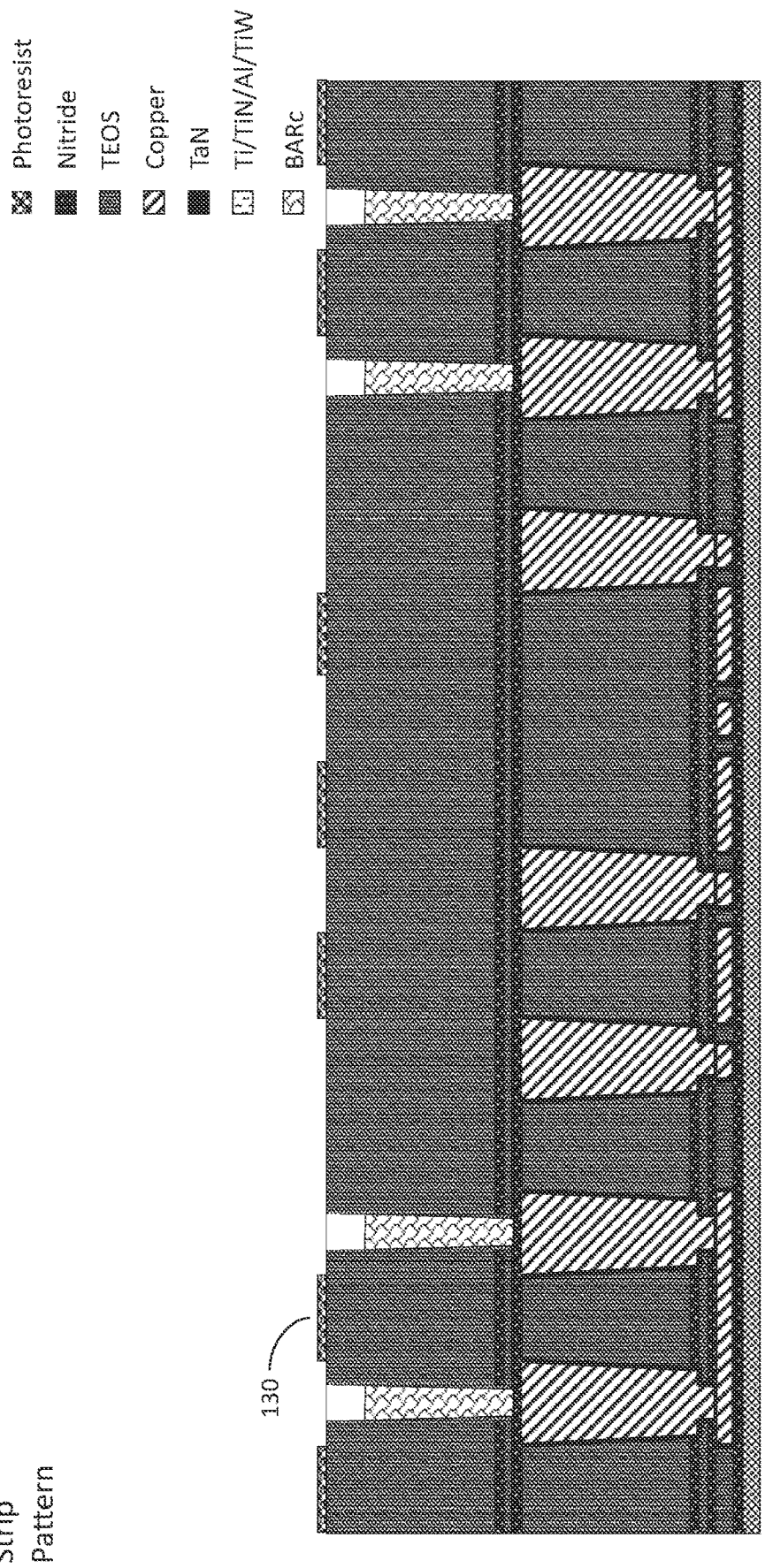

FIG. 25 illustrates subsequent steps in the disclosed fabrication processes. The photoresist layer from FIG. 24 is stripped. A new photoresist layer 130 is applied and patterned with the pattern for the third copper damascene layer.

Figure 26:
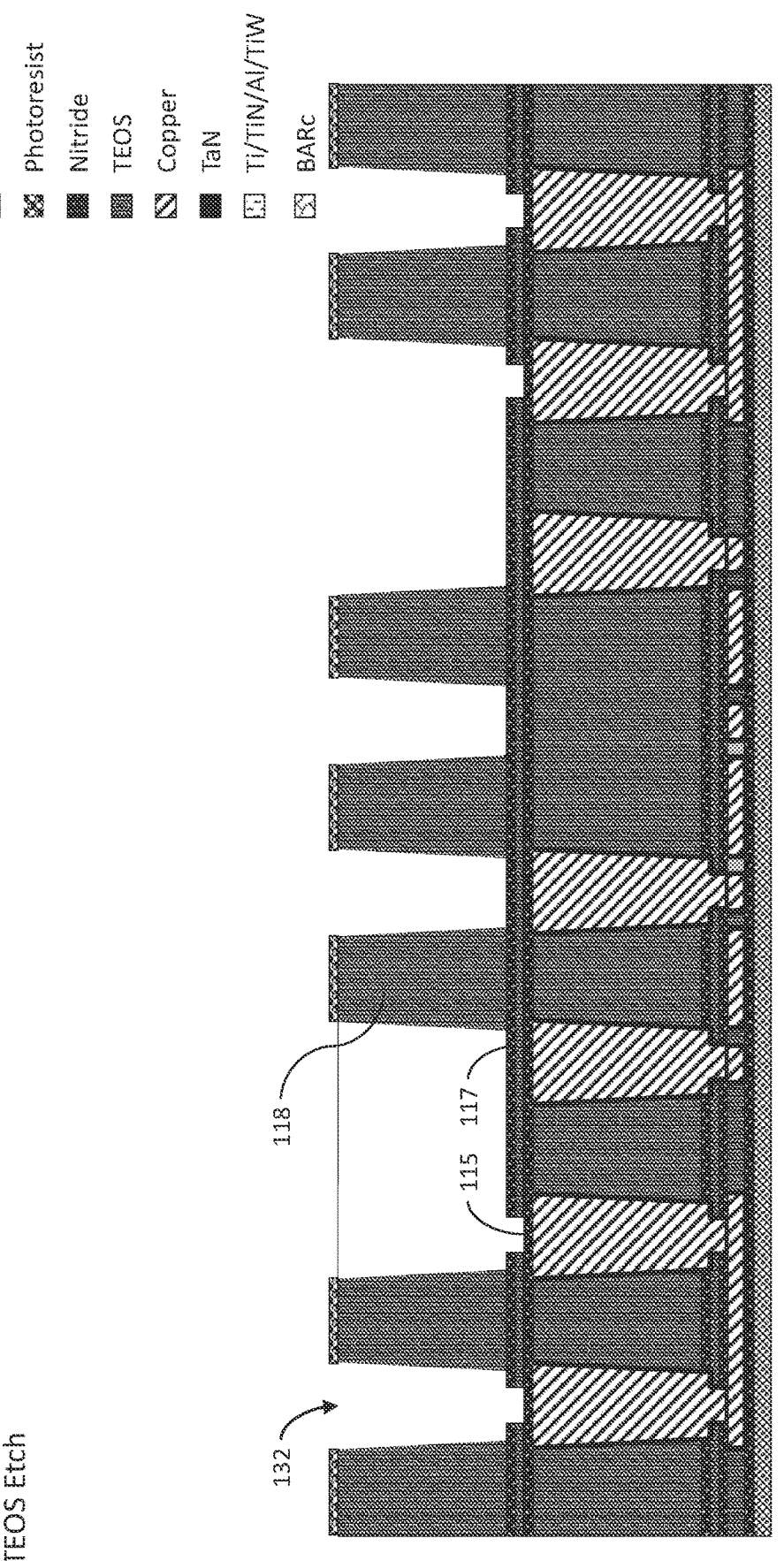

FIG. 26 illustrates subsequent steps in the disclosed fabrication processes. The third damascene oxide layer 118 is etched to form recesses 132. This etch stops on the upper thin nitride layer 117 and the lower thin nitride layer 115.

Figure 27:
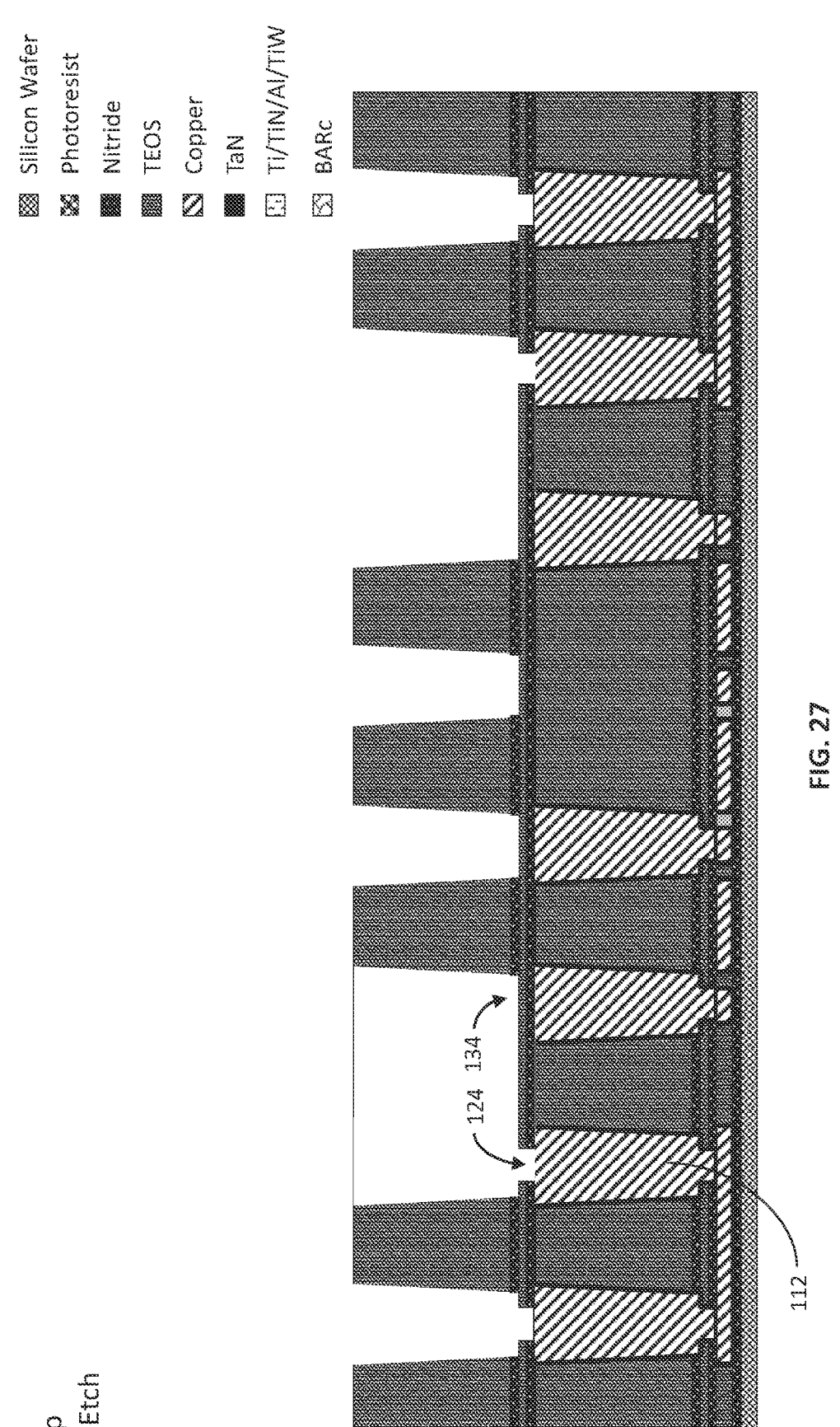

FIG. 27 illustrates subsequent steps in the disclosed fabrication processes. The photoresist layer from FIG. 26 is stripped. A nitride etch is then performed. This removes nitride in the vias 124, revealing the second copper damascene layer 112. Nitride from the 'shelf' area 134 is also removed, revealing the thin oxide layer.

Figure 28:
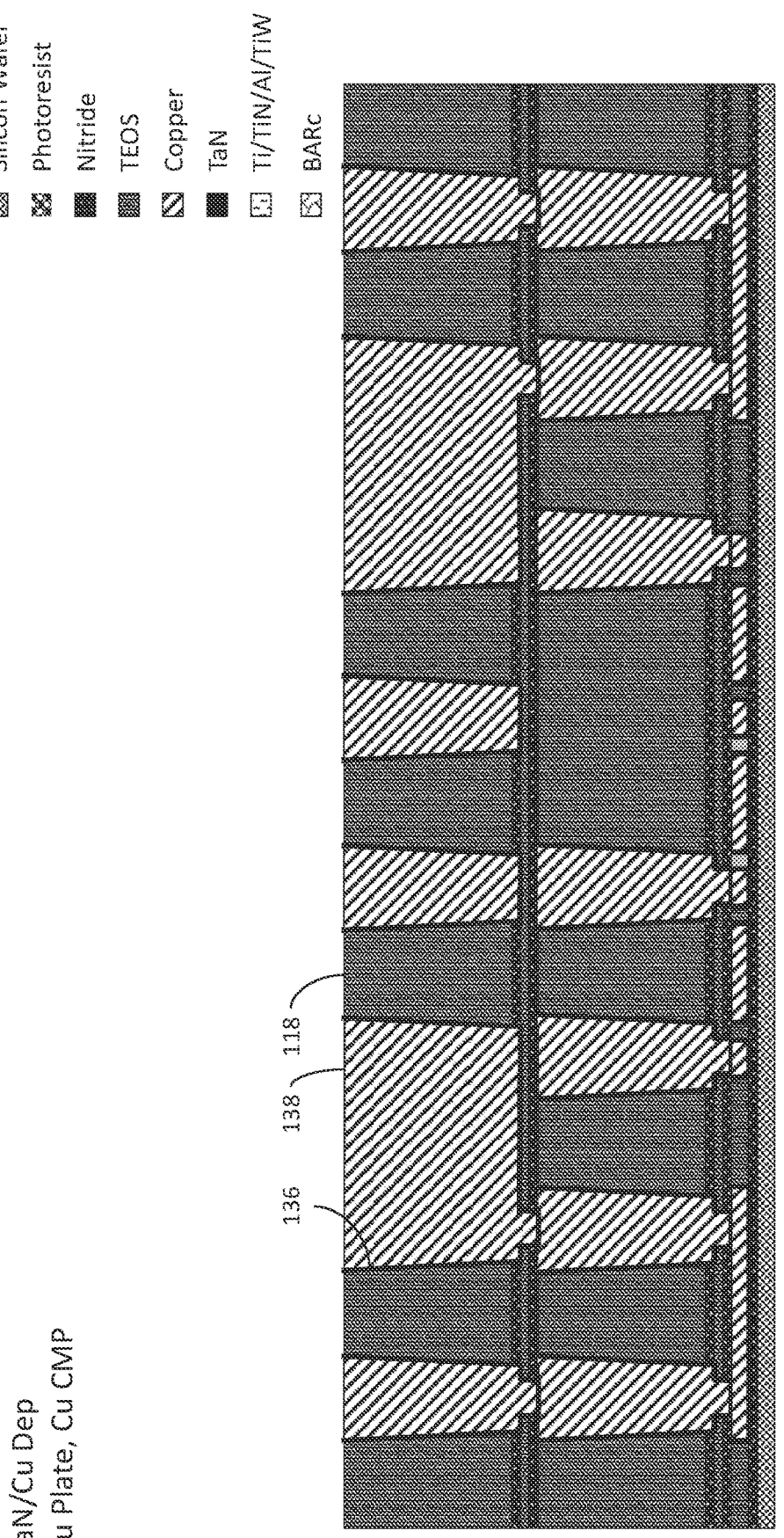

FIG. 28 illustrates subsequent steps in the disclosed fabrication processes. The third copper damascene layer is applied and patterned. To achieve this, a seed layer 136, such as Tantalum Nitride, is then deposited over the entire wafer. Electroplating is then used to deposit a copper layer 138 over the entire wafer. The seed layer and copper layer are then polished back stopping on the oxide layer 118, using techniques known to those practiced in the art.

Figure 29:
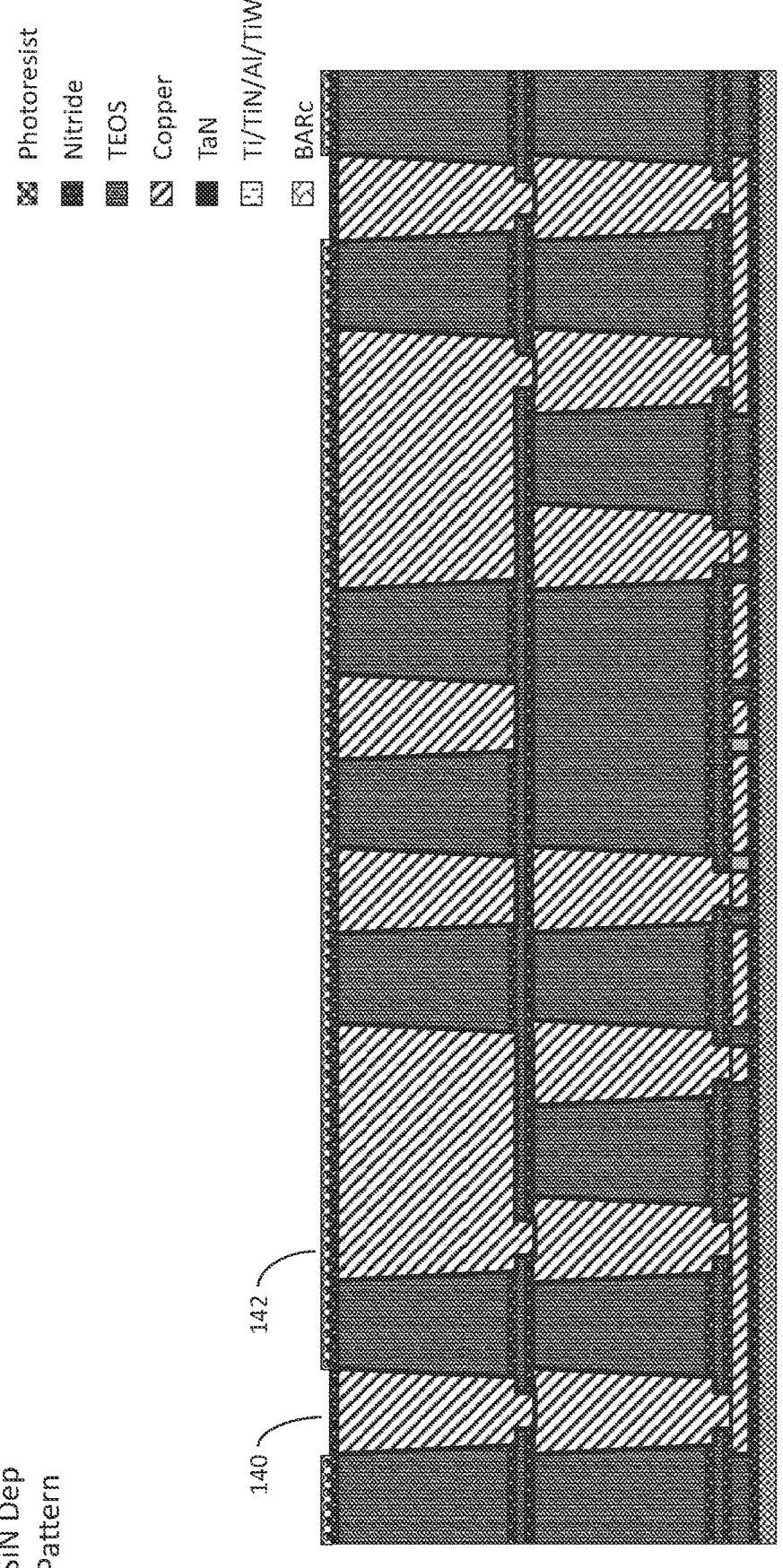

FIG. 29 illustrates subsequent steps in the disclosed fabrication processes. A thin nitride layer 140 is applied. A photoresist layer 142 is applied and patterned with the pattern for the wire bonding pad vias.

Figure 30:
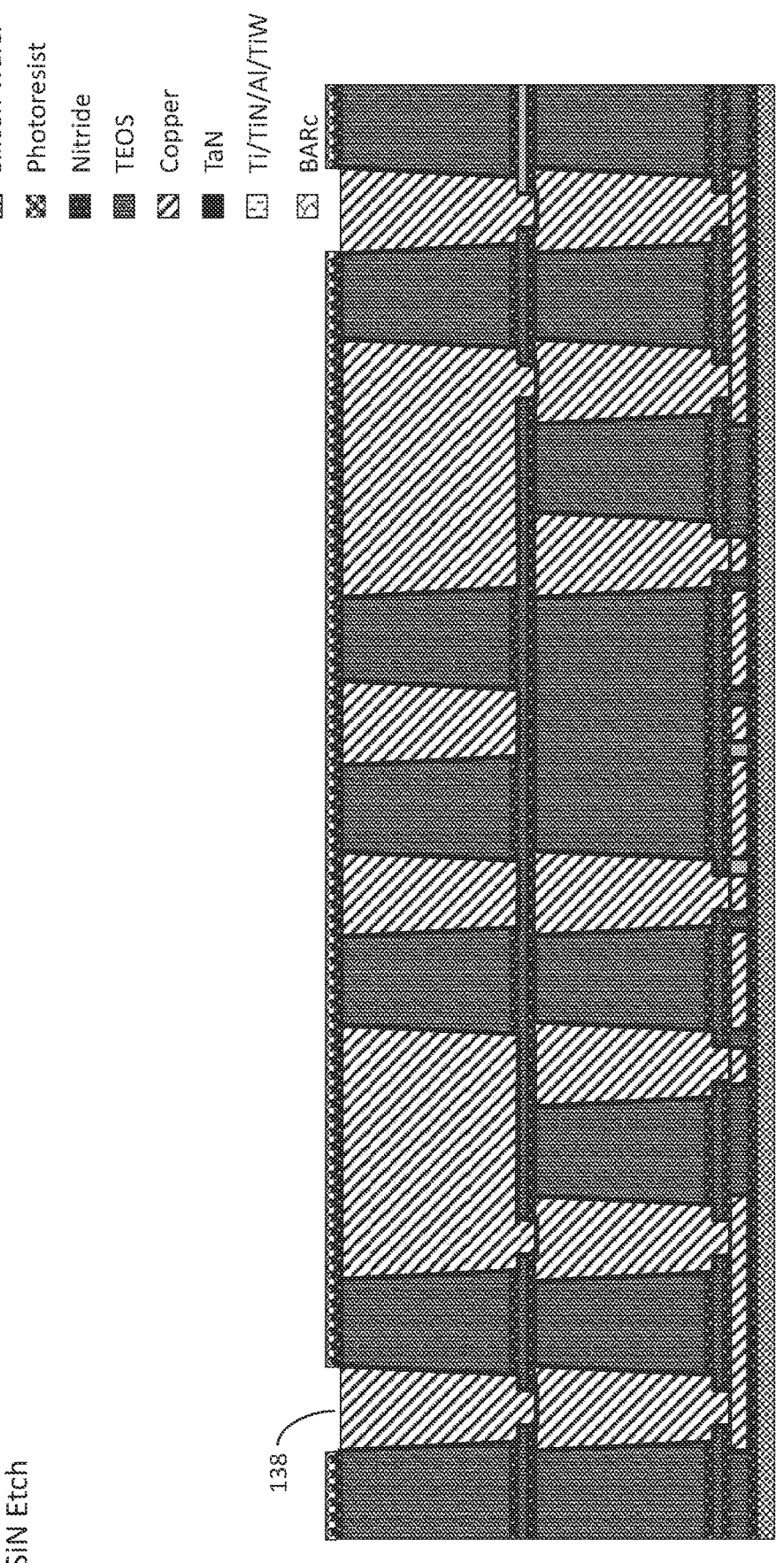

FIG. 30 illustrates subsequent steps in the disclosed fabrication processes. The nitride layer from the previous figure is etched to reveal the third copper damascene layer 138.

Figure 31:
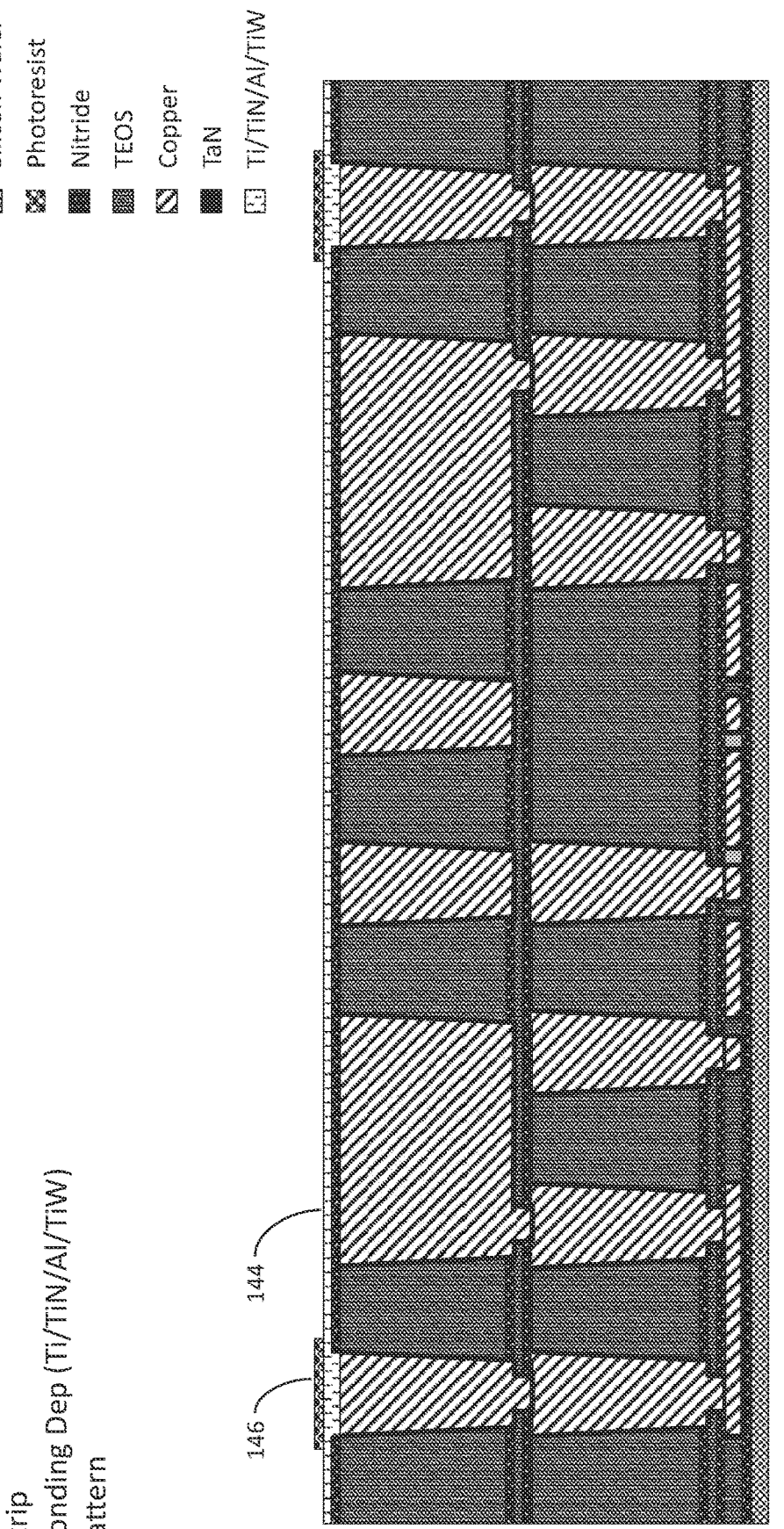

FIG. 31 illustrates subsequent steps in the disclosed fabrication processes. The photoresist layer from FIG. 30 is stripped. A wire bonding layer 144—such as a Titanium, Titanium-Nitride, Aluminum, and Titanium-Tungsten stack—is applied using techniques known to those practiced in the art. A photoresist layer 146 is applied and patterned with the pattern for the wire bond pads.

Figure 32:
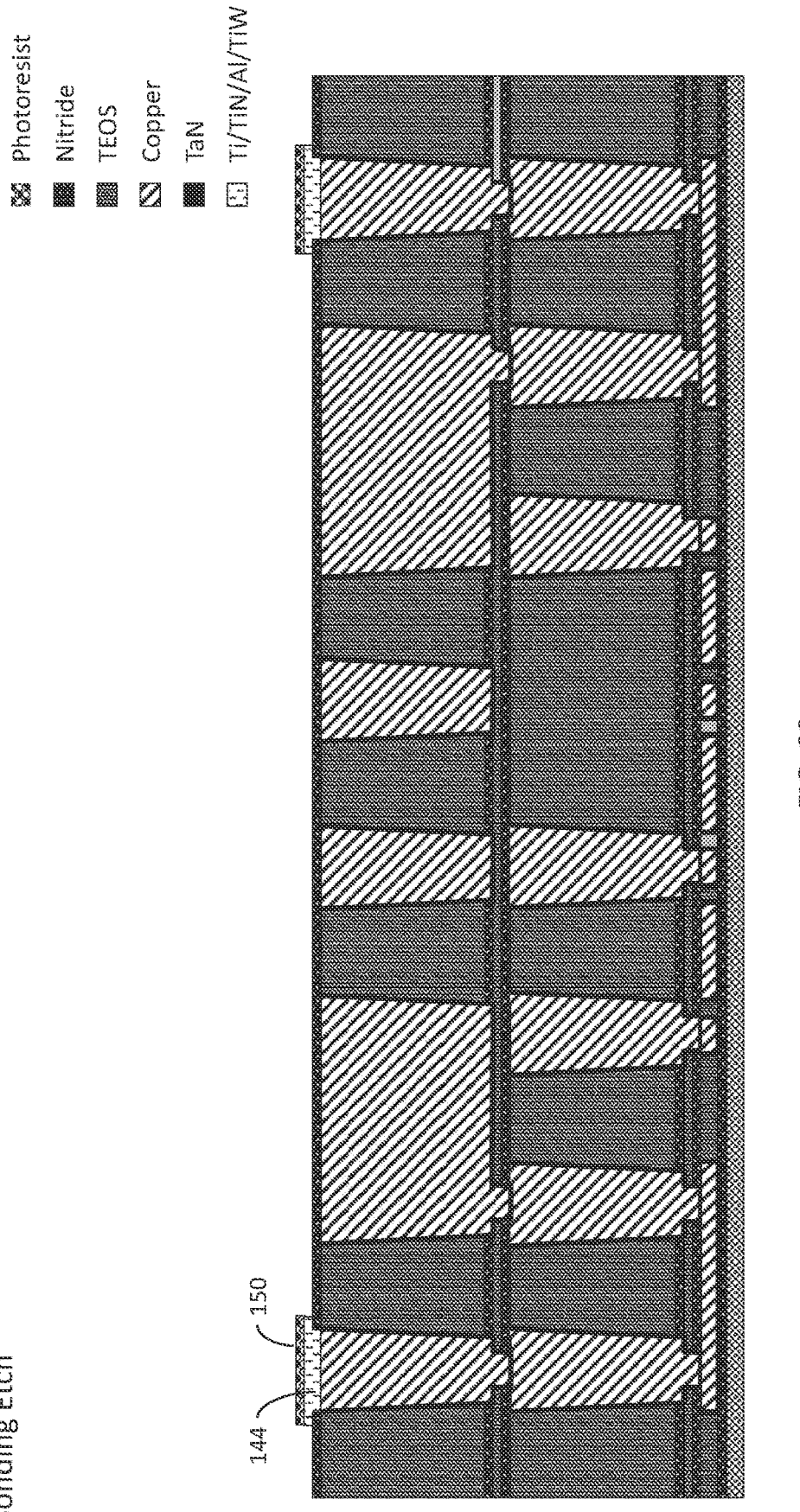

FIG. 32 illustrates subsequent steps in the disclosed fabrication processes. Wire bonding pads are formed by etching the wire bonding layer 144 using the photoresist layer 150 as an etch mask.

Figure 33:
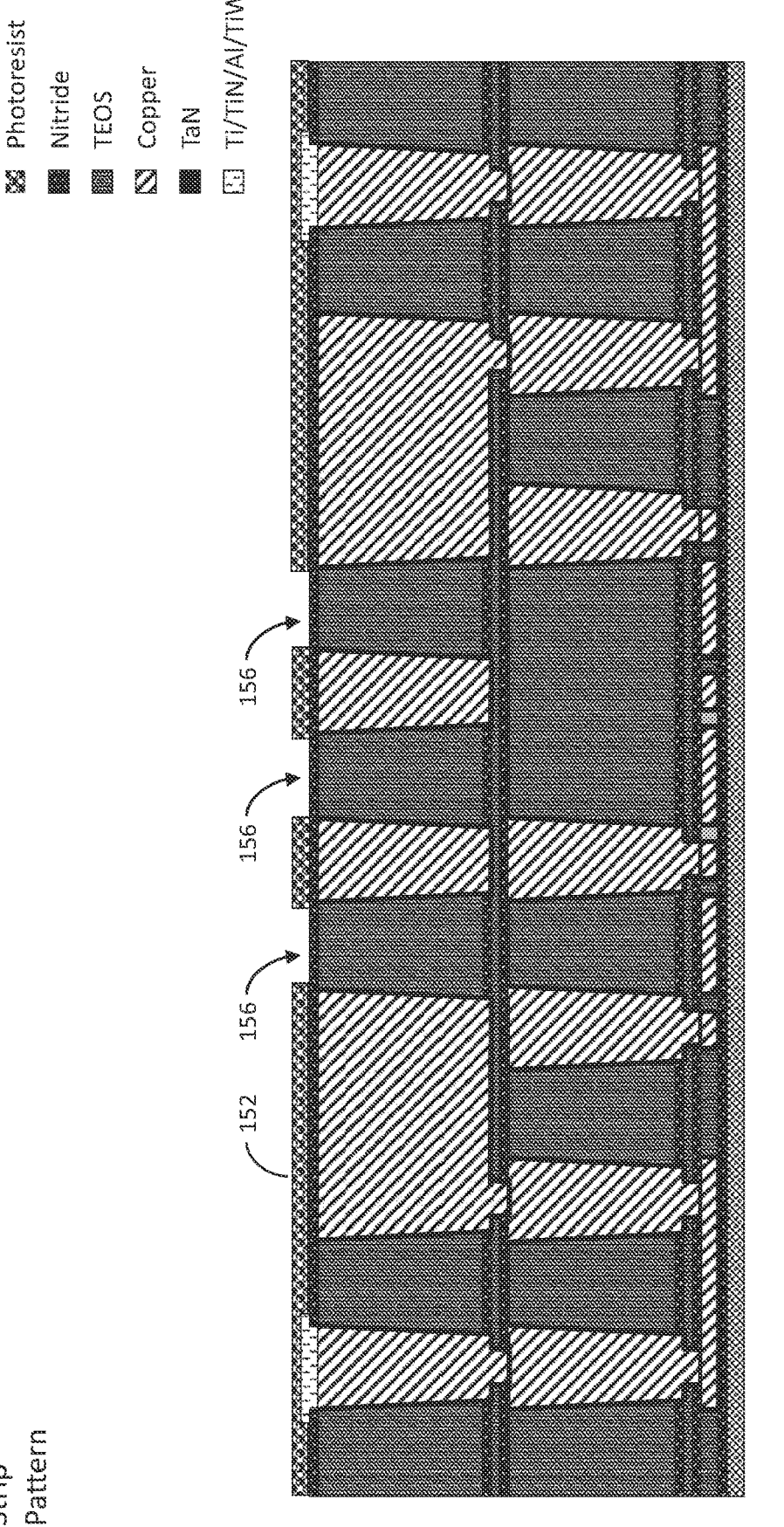

FIG. 33 illustrates subsequent steps in the disclosed fabrication processes. The photoresist layer from FIG. 32 is stripped. A new photoresist layer 152 is applied and patterned with the pattern for the liquid crystal optical cavities 156.

Figure 34:
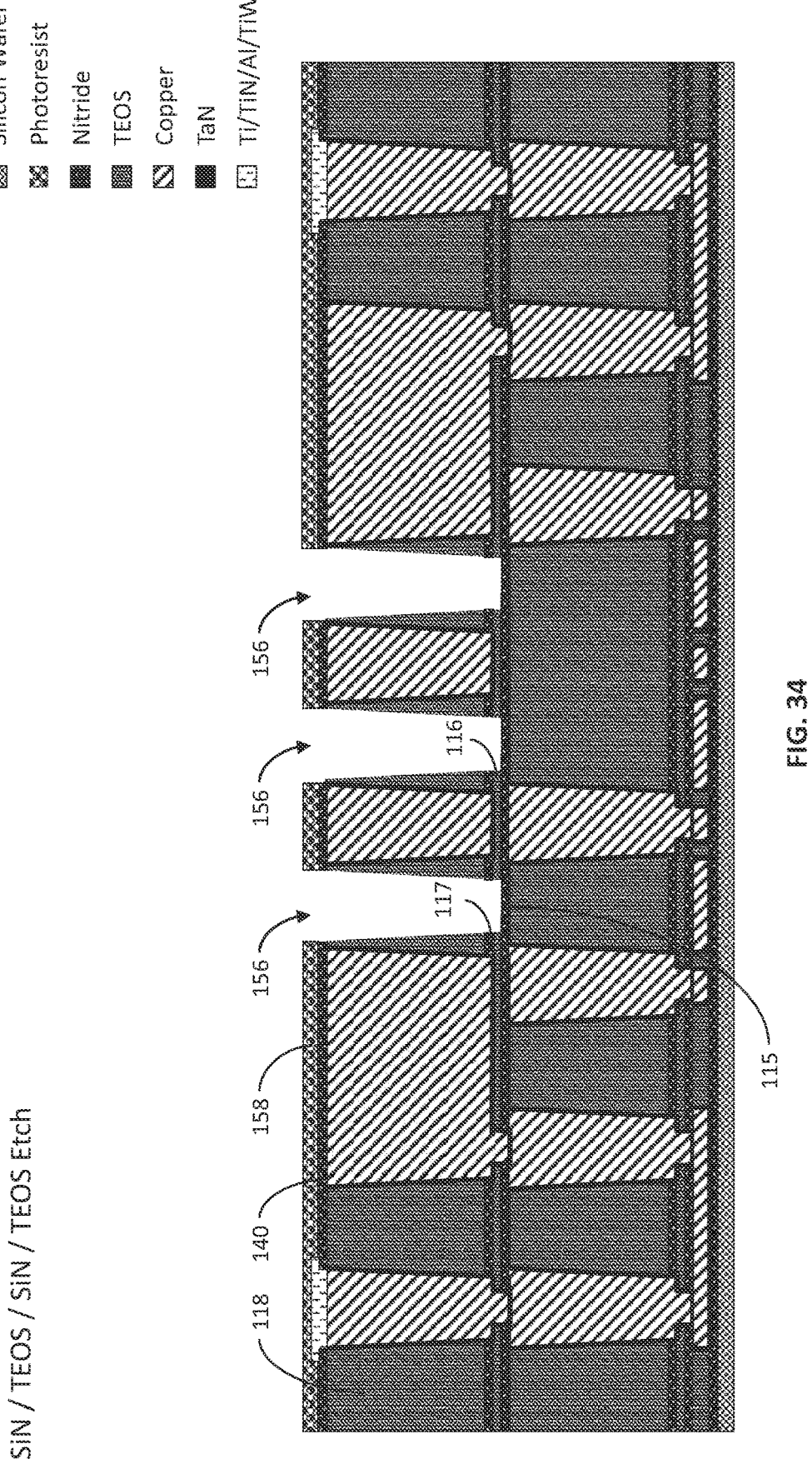

FIG. 34 illustrates subsequent steps in the disclosed fabrication processes. The first set of etches to form the optical cavities 156 are shown. The photoresist layer 158 is used as an etch mask to etch the top nitride layer 140, the third damascene oxide layer 118, the thin nitride layer 117 and oxide layer 116, stopping on the lower thin nitride layer 115.

Figure 35:
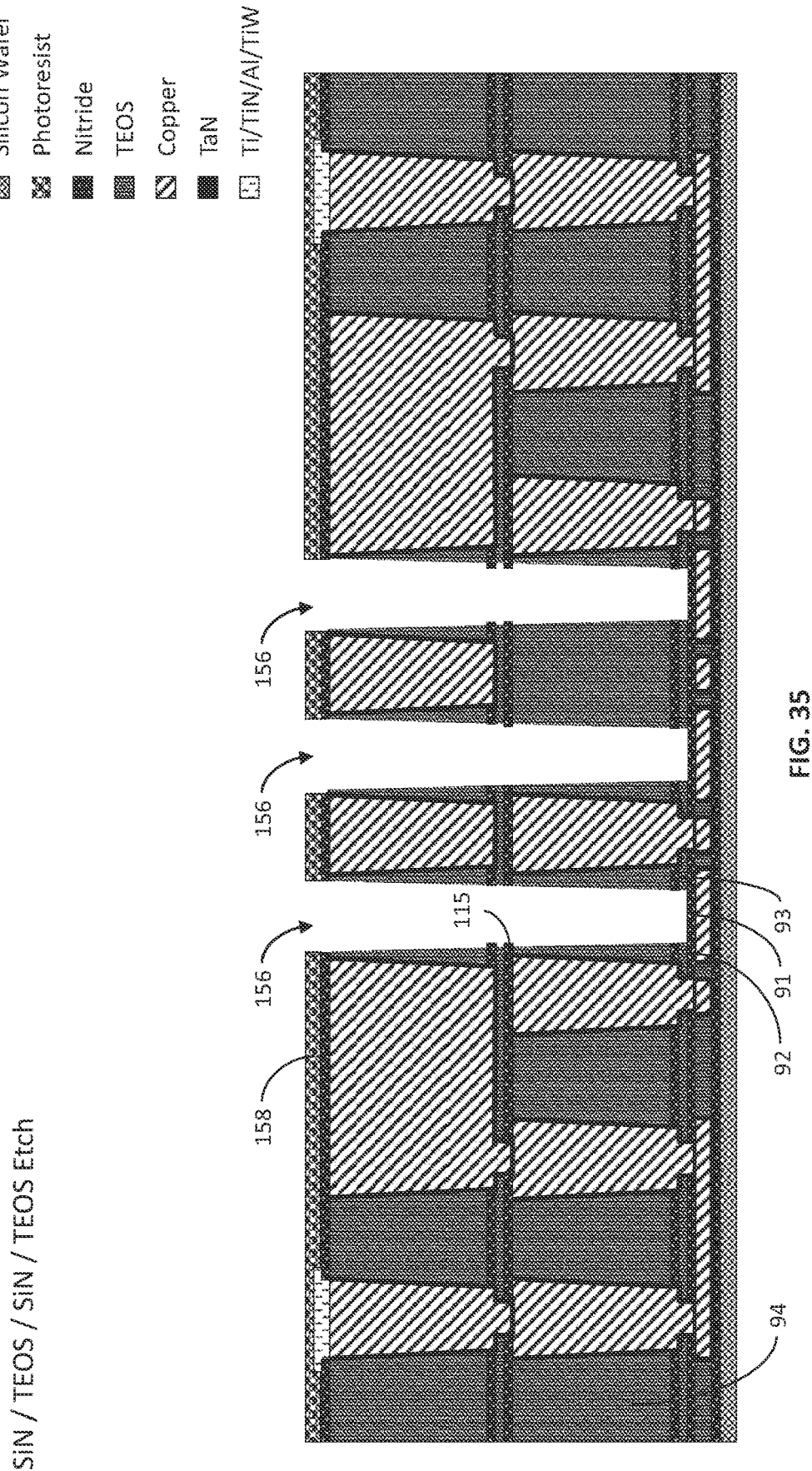

FIG. 35 illustrates subsequent steps in the disclosed fabrication processes. The second set of etches to form the optical cavities 156 are shown. The photoresist layer 158 is used as an etch mask to etch the nitride layer 115, the second damascene oxide layer 94, the thin nitride layer 93 and thin oxide layer 92, stopping on the lower thin nitride layer 91.

Figure 36:
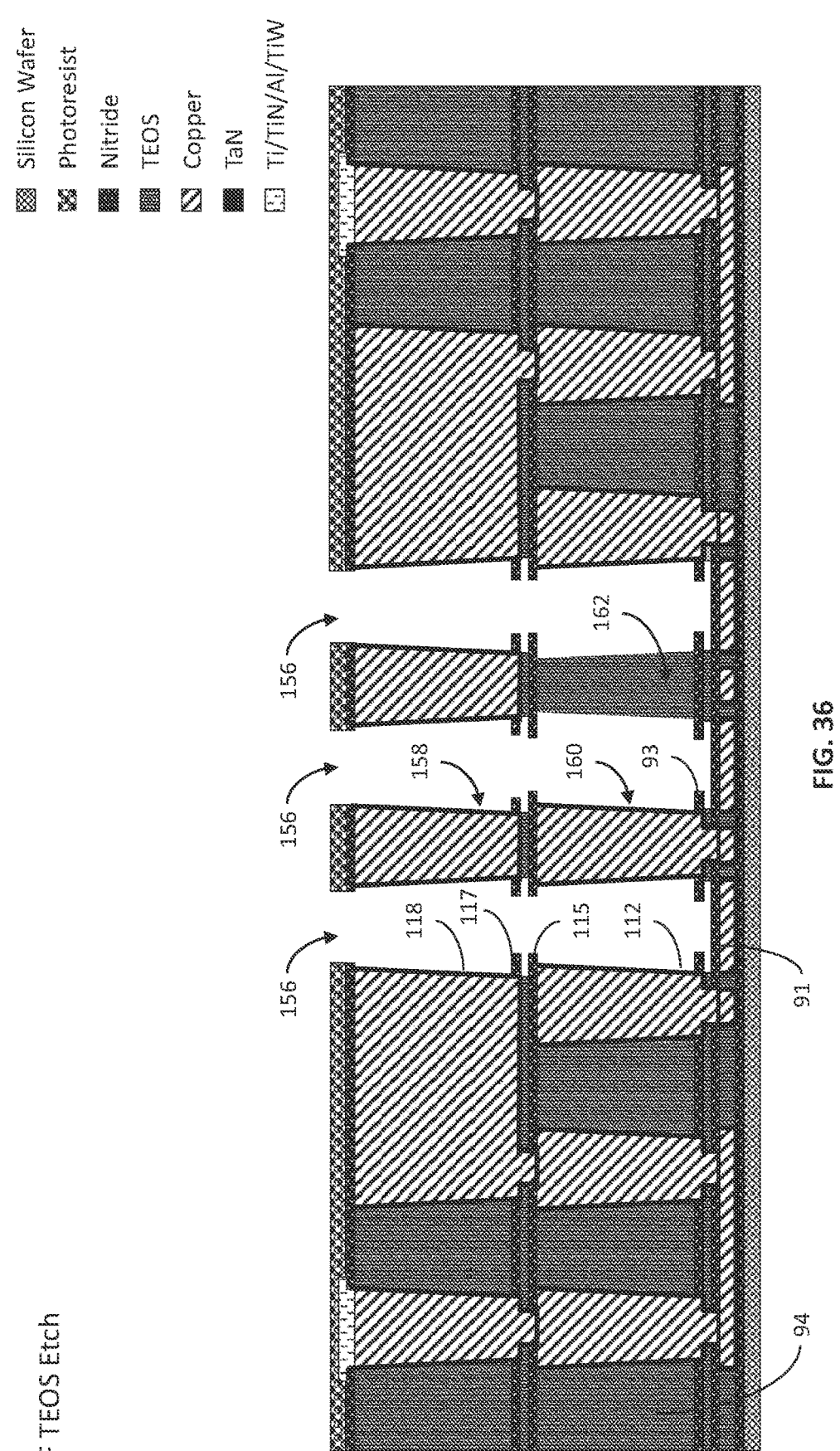

FIG. 36 illustrates subsequent steps in the disclosed fabrication processes. Fabrication of the optical cavities 156 continues. An isotropic oxide etch is performed using, for example, a dilute Hydrofluoric acid solution. This etch is timed to clear the oxide from the base of the middle damascene layer 112. In so doing, it also clears oxide from the walls of the upper damascene layer 118 as well. The second and third copper damascene layers are protected by the Tantalum Nitride layers in regions 158 and 160. The etch leaves numerous nitride layers exposed, for example 91, 93, 115, and 117. Area 162 represents the oxide separators 12 shown in FIG. 1.

Figure 37:
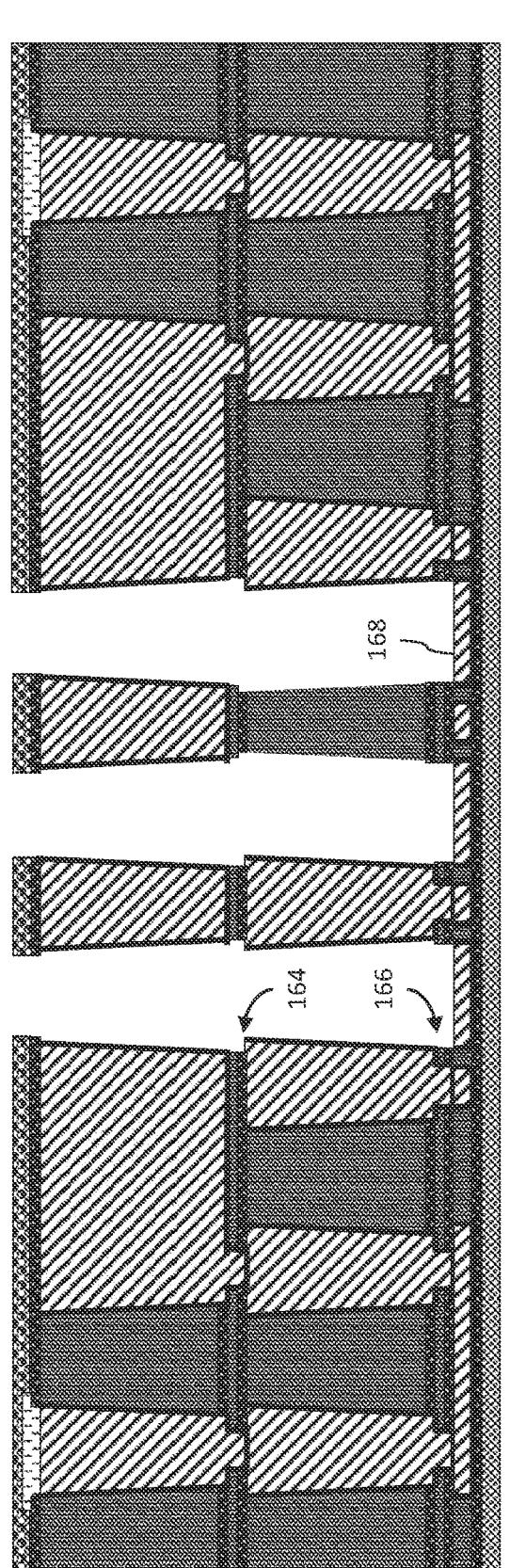

FIG. 37 illustrates subsequent steps in the disclosed fabrication processes. A nitride etch is performed to remove the hanging nitride layers, such as in areas 164 and 166. The nitride etch also removes the nitride layer covering the reflector 168, also described in FIG. 1 by reference number 24.

Figure 38:
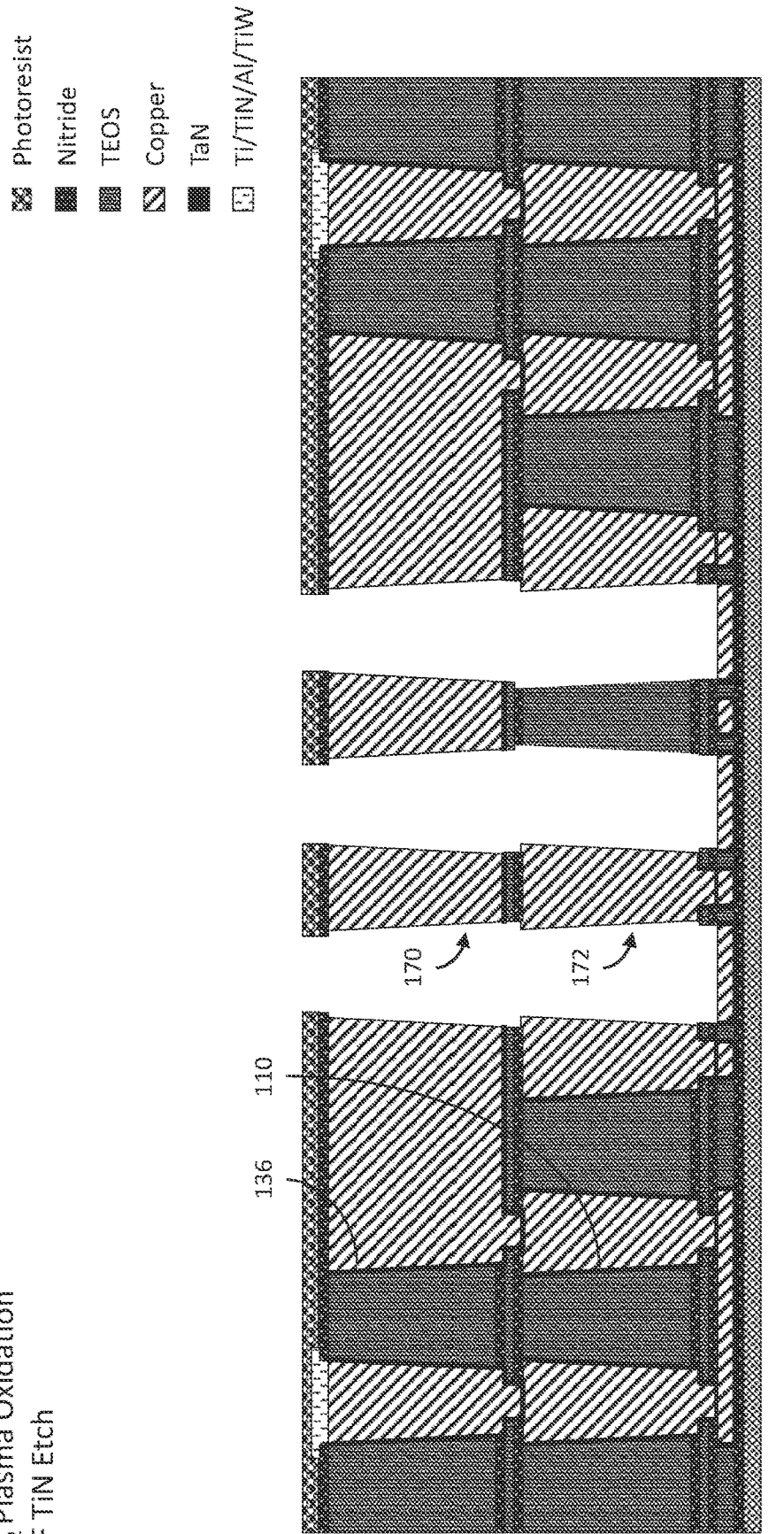

FIG. 38 illustrates subsequent steps in the disclosed fabrication processes. The Tantalum Nitride layers 110 and 136 are removed, for example in areas 170 and 172, using techniques known to those in the art. For example, a plasma oxidation step followed by a hydrofluoric acid etch is used.

Figure 39:
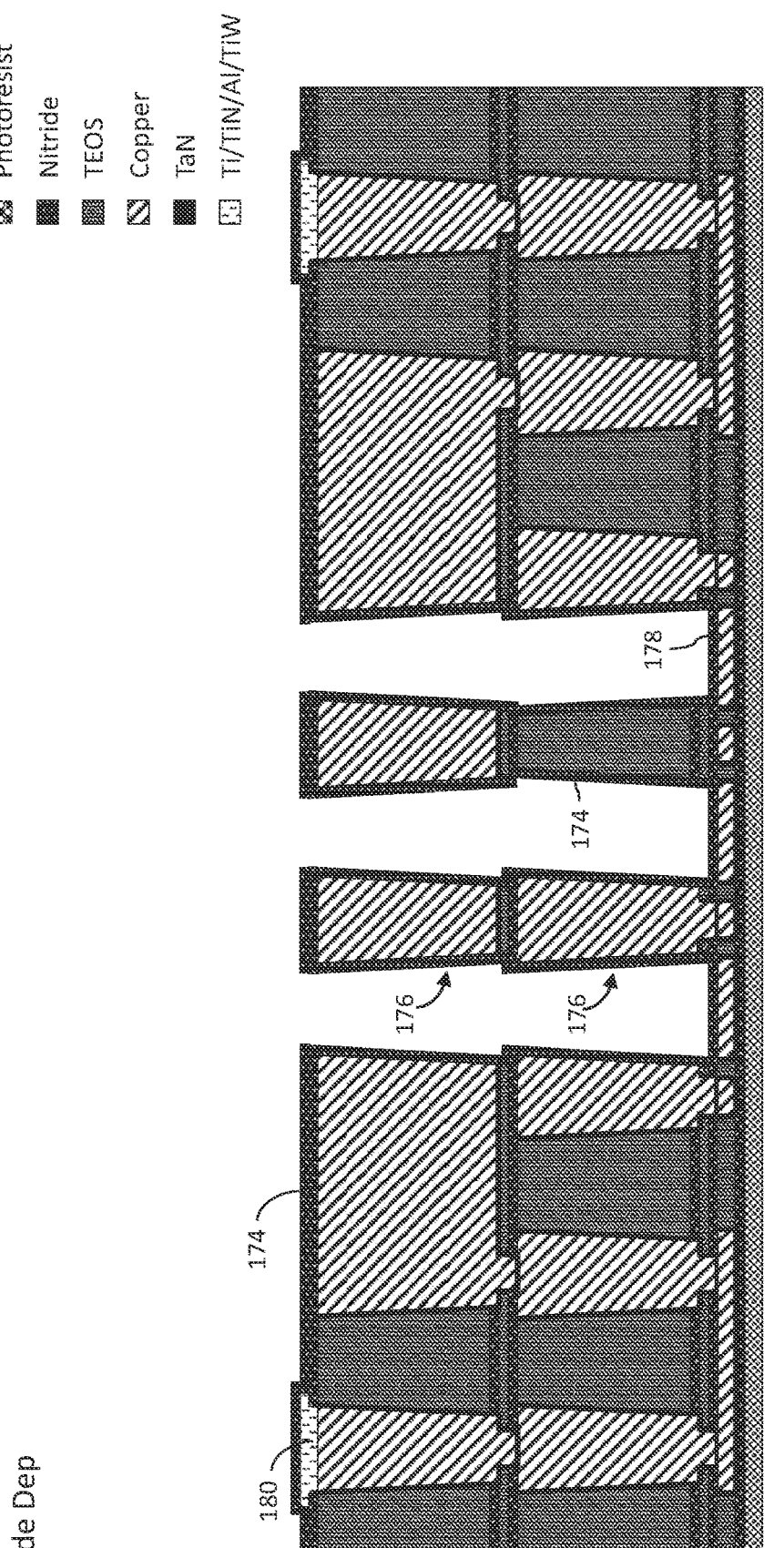

FIG. 39 illustrates subsequent steps in the disclosed fabrication processes. The photoresist layer shown in FIG. 38 is stripped. Then a nitride layer 174 is deposited covering the wafer. This layer covers the optical cavity sidewalls 176, the reflector 178, and the bond pads 180.

Figure 40:
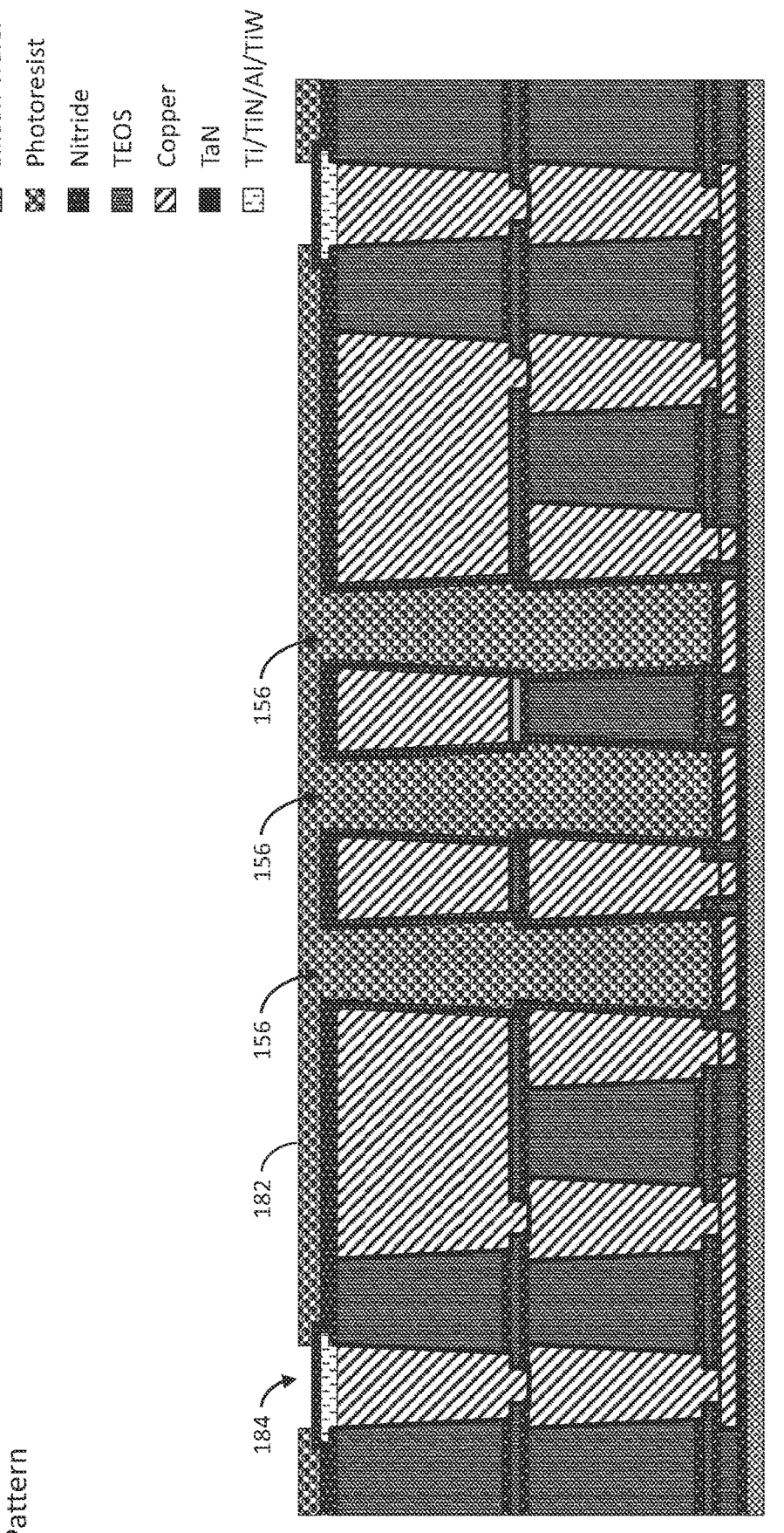

FIG. 40 illustrates subsequent steps in the disclosed fabrication processes. A photoresist layer 182 is applied and patterned in the area of the wire bond pads 184. The photoresist fills the optical cavities 156.

Figure 41:
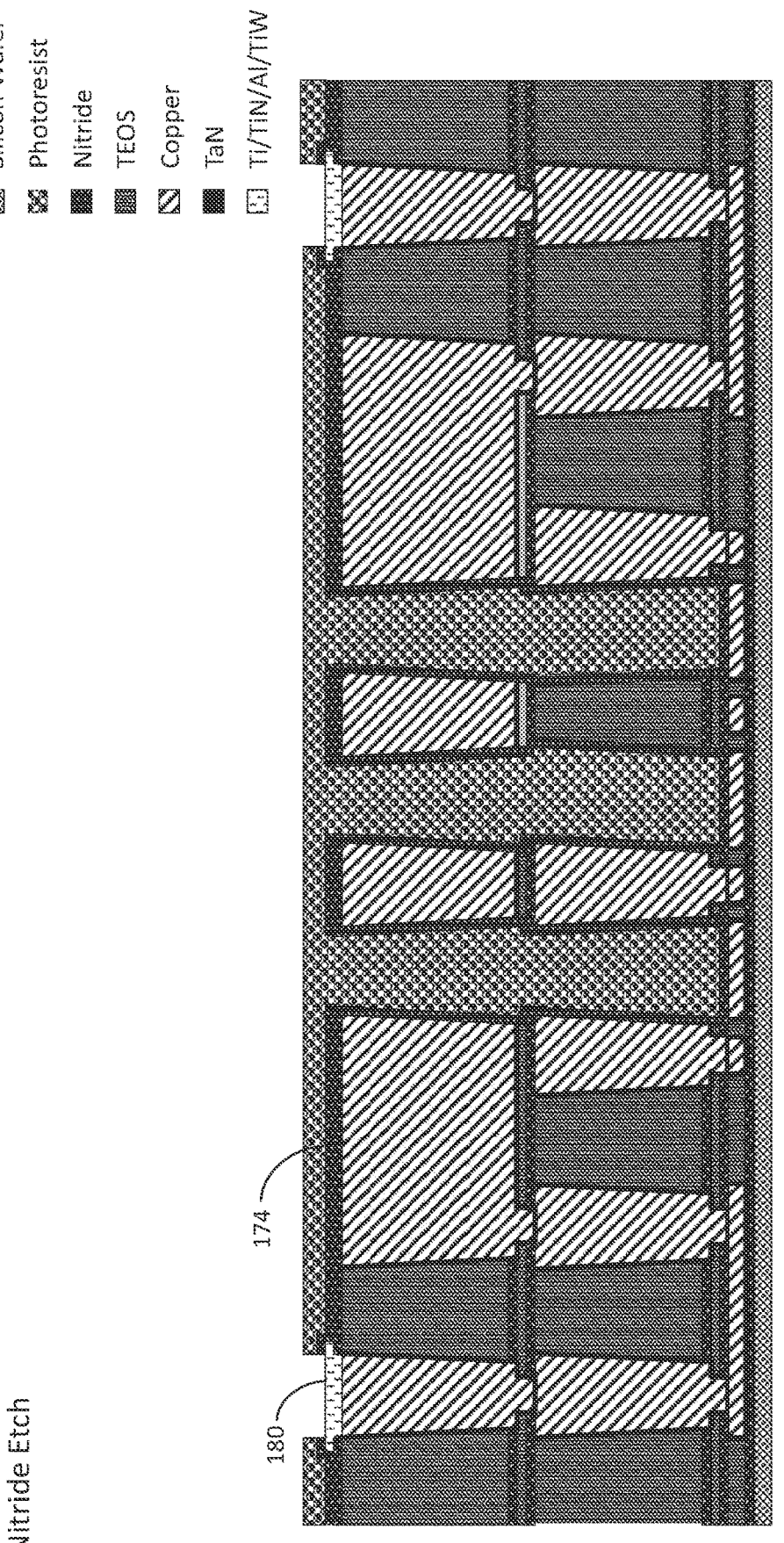

FIG. 41 illustrates subsequent steps in the disclosed fabrication processes. The nitride layer 174 is etched, revealing the bond pads 180.

Figure 42:
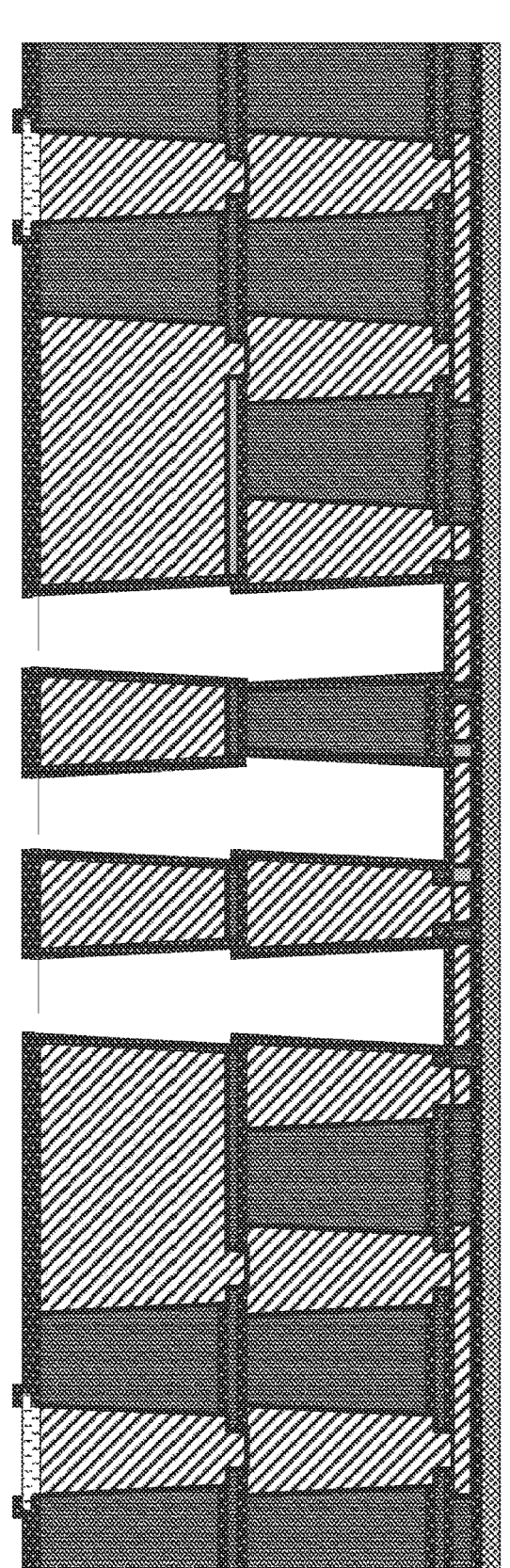

FIG. 42 illustrates subsequent steps in the disclosed fabrication processes. The photoresist layer depicted in FIG. 41 is stripped to reveal the fabricated device.

Figure 43:
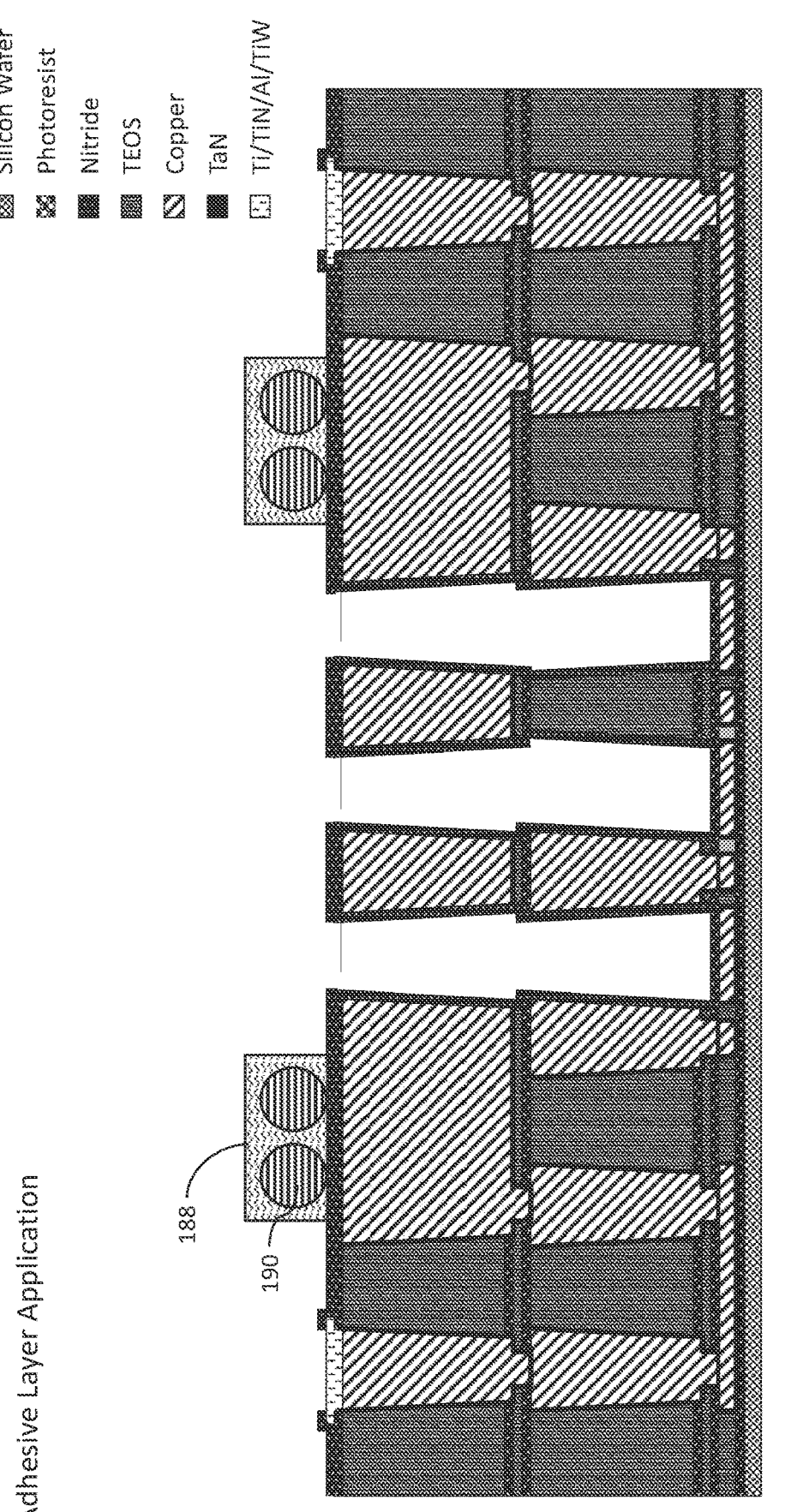

FIG. 43 illustrates initial steps in the packaging of the disclosed device. An adhesive bonding layer 188 containing spacers 190 is applied using techniques known to those skilled in the art. For example, techniques similar to ink-jet printing can ban used.

Figure 44:
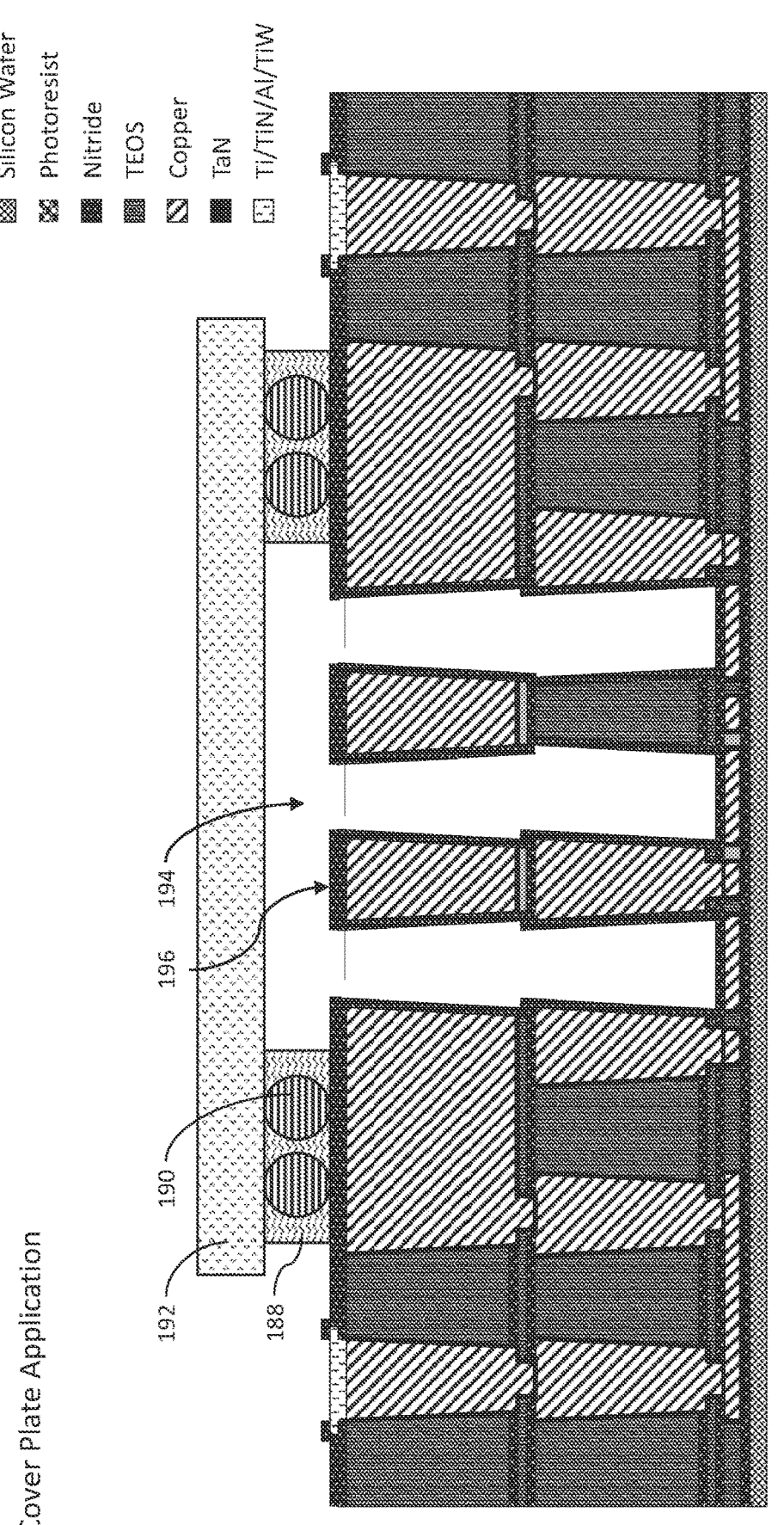

FIG. 44 illustrates subsequent steps in the packaging of the disclosed device. A cover layer 192 made of, for example, glass is aligned and pressed onto the bonding layer 188. The cover layer 192 compresses the bonding layer 188, and presses onto the spacers 190. This creates a cavity area 194. In one embodiment, photoresist material (not shown) is applied to the glass cover layer 192 and patterned so to fill the portion of the cavity 194 between the glass cover plate 192 and the top of the fabricated device 196.

Figure 45:
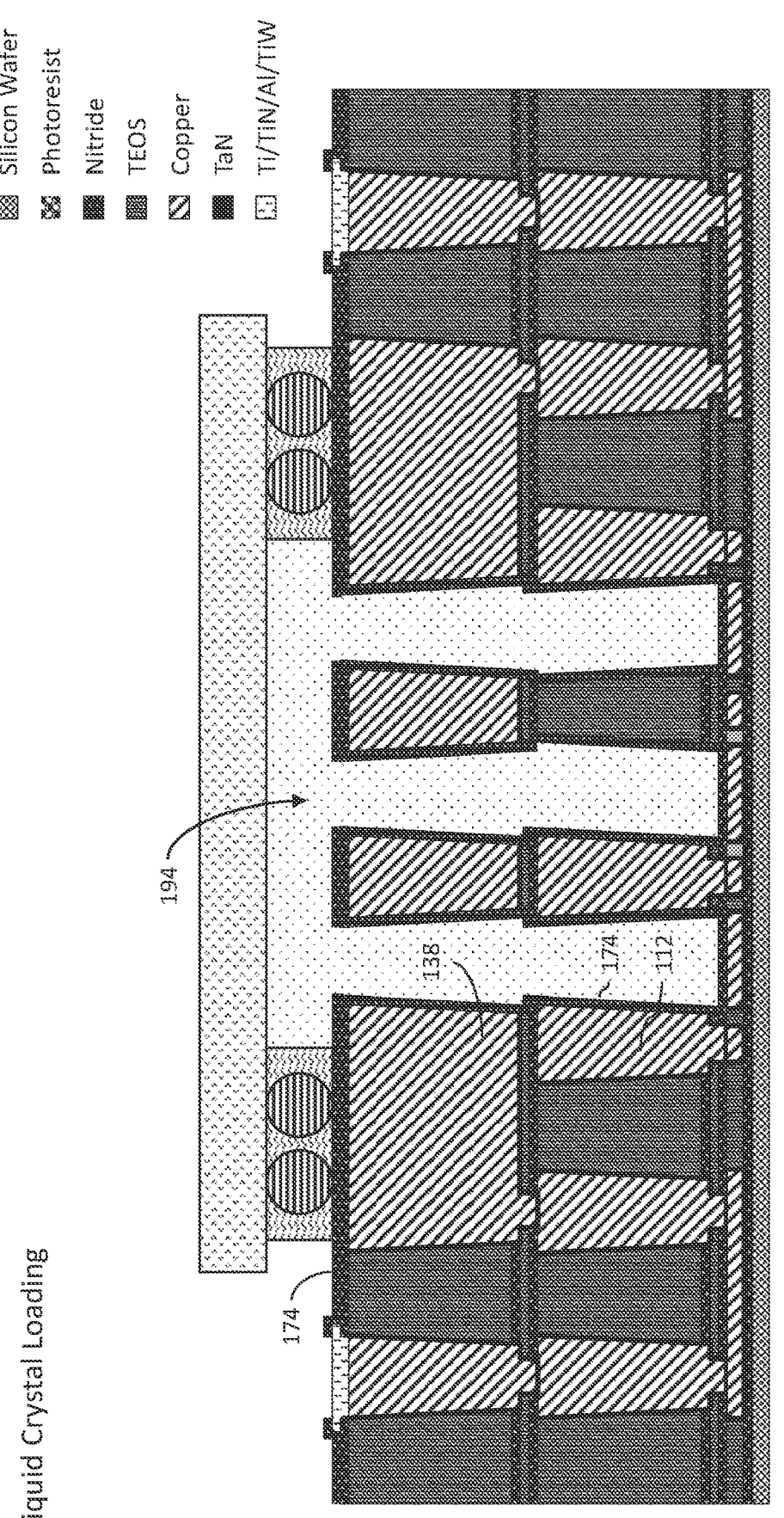

FIG. 45 illustrates subsequent steps in the packaging of the disclosed device. Liquid Crystal material is loaded into cavity 194 using techniques known to those practiced in the art. The Liquid Crystal material is electrically isolated from conductors, such as 112 and 138, by the nitride layer 174.

Figure 46:
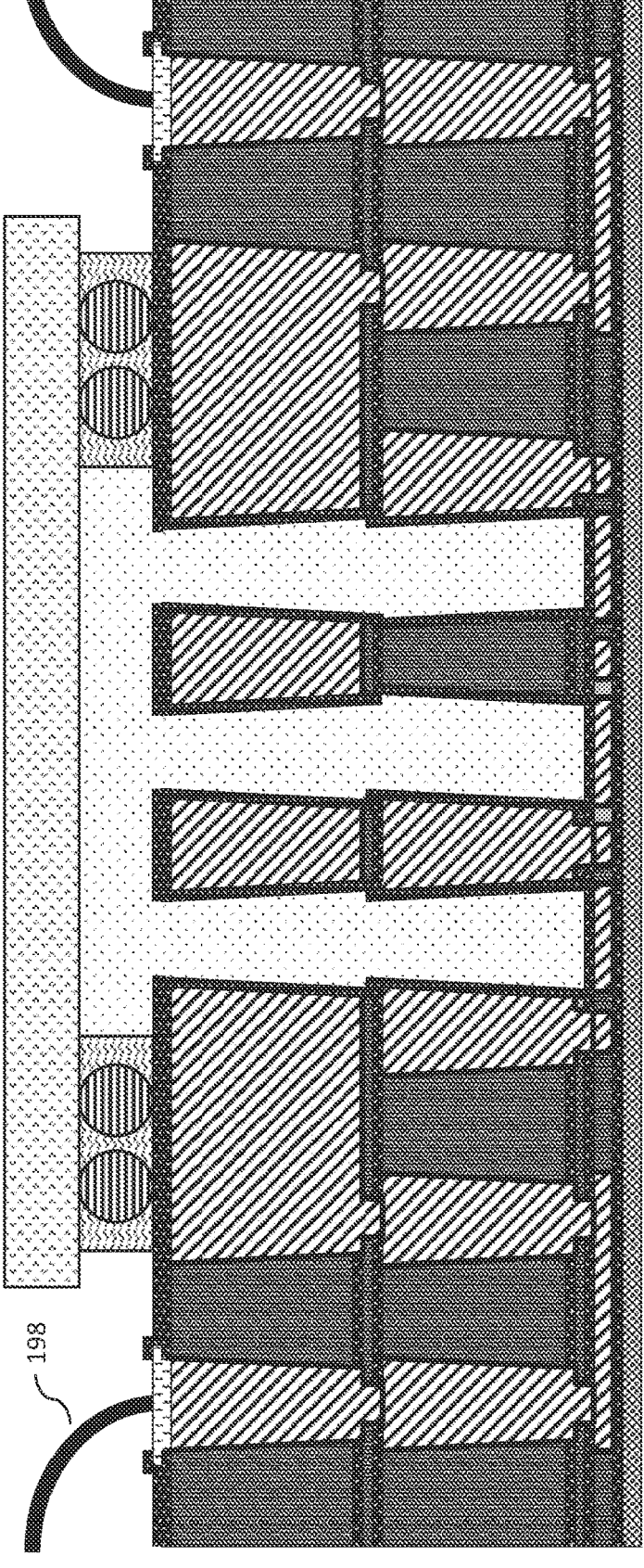

FIG. 46 illustrates subsequent steps in the packaging of the disclosed device. The device is diced, mounted in a package, and electrically connected to the package (not shown) using wire bonds, such as 198.

DETAILED DESCRIPTION

Two Dimensional Reflect Array Devices

One or more embodiments disclosed herein relates to a two-dimensional reflect array device. The device can be used as part of systems such as optical communication systems, LIDAR systems, directed energy systems, to name a few. The purpose of the device is to redirect light. With reference to FIG. 12, the device can be used in either transmit or receive mode. In transmit mode the light from a laser or other optical source illuminates the device. The device is then configured to direct light in a desired location, such as towards a target receiver. In receive mode, light from a distant source illuminates the device. The device then serves to redirect, and optionally concentrate, the light onto a detector. Numerous other uses and configurations are readily apparent to those skilled in the art.

Figure 4:
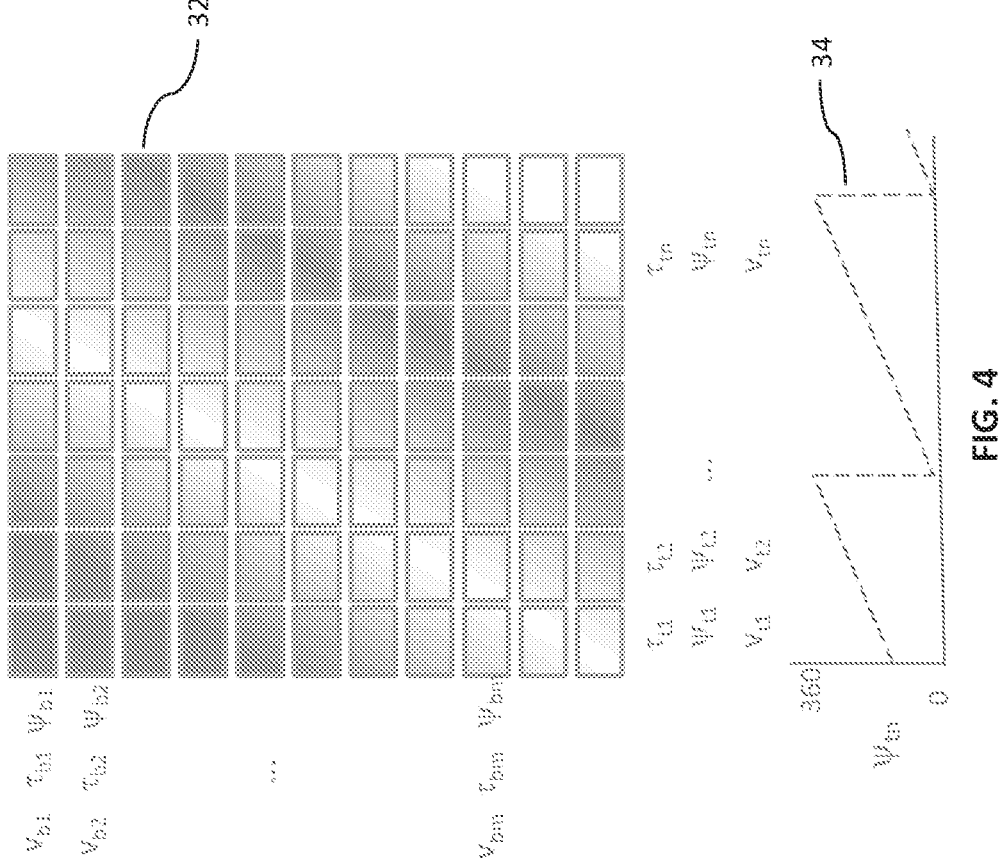
FIG. 4 illustrates a schematic depiction of an exemplary two-dimensional electro-magnetic reflect-array system in accordance with one or more embodiments. The system comprises an two-dimensional array of optical elements 32. To effect the redirection of electromagnetic energy, each of the optical elements 32 absorbs and then reemits a portion of the incident electromagnetic energy. To control the manner of reemission, each of the optical elements 32 is actuated with one or more control signals to select a desired phase (or phase shift) and amplitude (or attenuation) of the reemitted electromagnetic energy. Through coherent recombination of the reemitted electromagnetic energy from each of the optical elements 32, a reemission pattern is generated, such as a beam directed in a desirable direction. One or more control signals is applied to elements in each of two axes. In one embodiment, a control signal is applied to each row of elements, and independently to each column of elements. The phase shift induced at each element is a function (such as a superposition) of phase shifts and amplitudes commanded for each row and each column. In one embodiment, directing a saw-tooth phase shift pattern 34 on each of the horizontal and vertical axes causes an optical beam incident upon the array to be redirected in a chosen direction.

As shown in FIG. 4, reflect array devices comprises a two-dimensional array of optical elements. The reflect-array is illuminated with electromagnetic radiation (for example, light). Each of the optical elements absorbs and then reemits a portion of the incident light. The optical elements also serve to adjust the phase and amplitude of the reemitted light relative to the absorbed light. Through controlling the manner in which each element alters the frequency and amplitude of the emitted light, the light reemitted by the various optical elements constructively combine to result in a desired emission pattern, for example, a beam directed in an intended direction.

To generate a simple redirection of the incident light, a saw-tooth pattern of phase shifts is commanded to the various elements. To redirect a beam in an arbitrary direction in two dimensions, a saw tooth pattern must be able to be oriented in the plane of the device in any orientation. One strategy for achieving this is to generate individual control signals for each of optical elements. However, as discussed, this requires $n^2$ control lines, and is generally unachievable.

Figure 5:
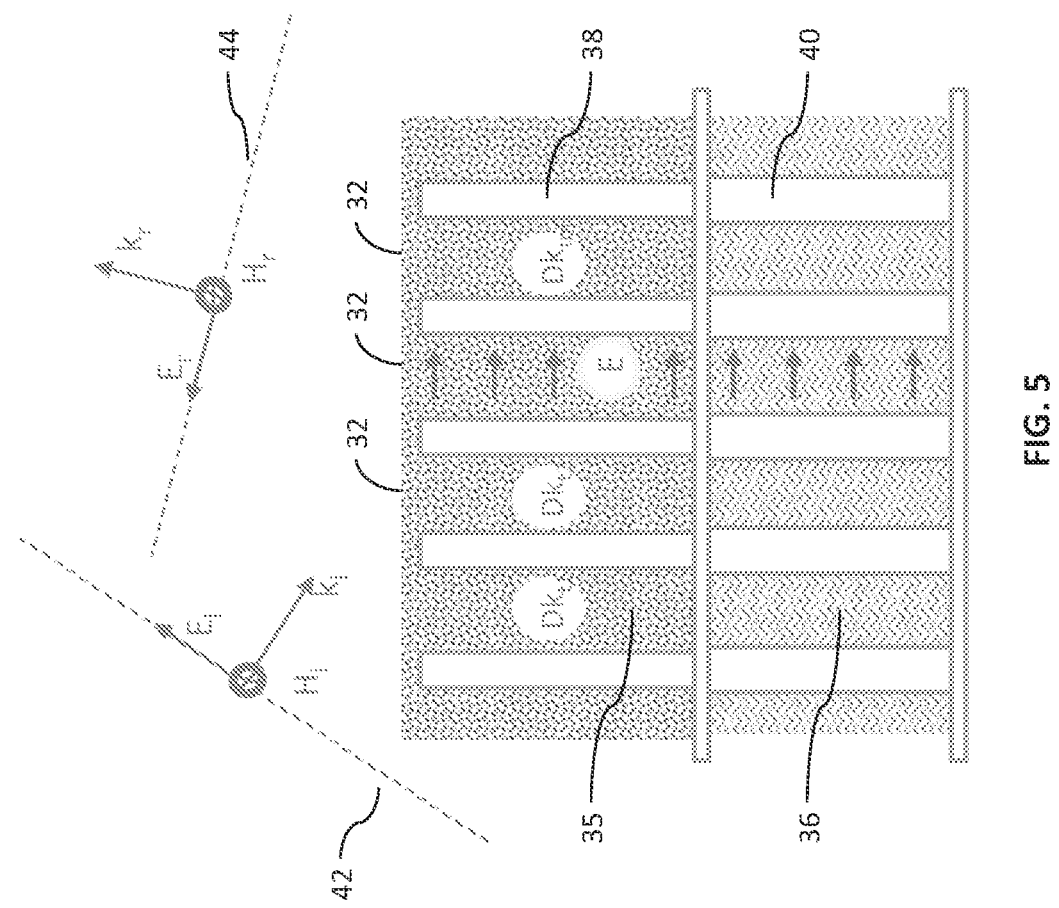
FIG. 5 is a cross-sectional view depicting operation of an exemplary beam steering device in accordance with one or more embodiments. The illustration depicts multiple two-layer optical elements 32. Each the optical element comprises two optical cavities: an upper-layer cavity 35 and a lower-layer cavity 36. Each cavity is substantially filled with material, such as a liquid crystal material, whose electromagnetic properties may be varied through application of an electric field. The optical cavities are each bounded on at least two sides by two electrodes. The upper-layer optical cavities 35 are bounded by upper-layer electrodes 38. The lower-layer optical cavities are bounded by lower-layer electrodes 40.
Figure 6:
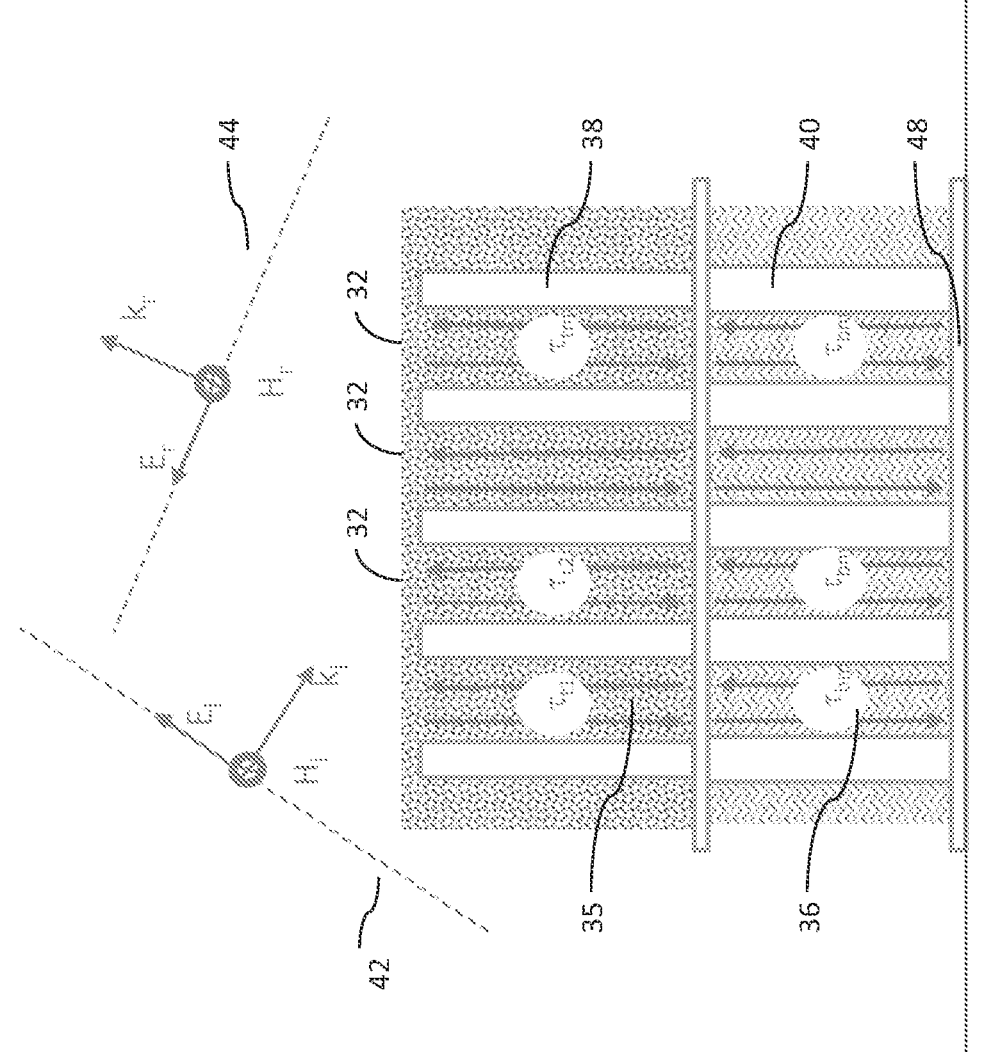
FIG. 6 is a cross-sectional view depicting operation of an exemplary beam steering device in accordance with one or more embodiments. The illustration includes multiple two-layer optical elements 32. The incident electromagnetic energy 42 impinges upon the upper-layer optical cavities 35 and is bound by the upper-layer electrodes 38. The electromagnetic energy continues to lower-level optical cavities 36 where the energy is bound by lower-layer electrodes 40. The energy then travels to the bottom of the lower-level optical cavities 36 and is reflected back through the lower-level optical cavities 36 and into the upper-level optical cavities 35. In one embodiment, reflection at the bottom of the lower-level optical cavities is effected using reflector structure, not shown, at the bottom of the lower-level optical cavities, for example in region 48. Upon reaching the top of the upper-level optical cavities 35 some or all of the electromagnetic energy is reemitted. Optionally, for optical cavities that comprise optical resonators, a portion of the electromagnetic energy is reflected back down through into the upper-level and lower-level optical cavities, 35 and 36, repeating the resonant cycle. The upper-level and lower-level optical cavities 35 and 36 are filled with a material whose electromagnetic properties can be controlled, for example, through application of electric fields. In this embodiment, the material is a liquid crystal material. Application of electric potentials on the upper-level and lower-level electrodes 38 and 40 generates electric fields in the upper-level and lower-level optical cavities 35 and 36. By controlling the potentials applied to the electrodes 38 and 40, and thereby controlling the electromagnetic property of the material in the optical cavities 35 and 36, and thereby causing the re-emitted energy from each element 32 to experiences a controllable change in amplitude and phase relative to the incident electromagnetic energy 42. Through prudent selection of the voltage biases for each of the upper-level and lower-level electrodes, 38 and 40, the coherent recombination of the energy reemitted from each of the elements 32 forms a desired electromagnetic pattern, such as a beam of electromagnetic energy 44 emitted in a desired direction $k_r$.
Figure 7:
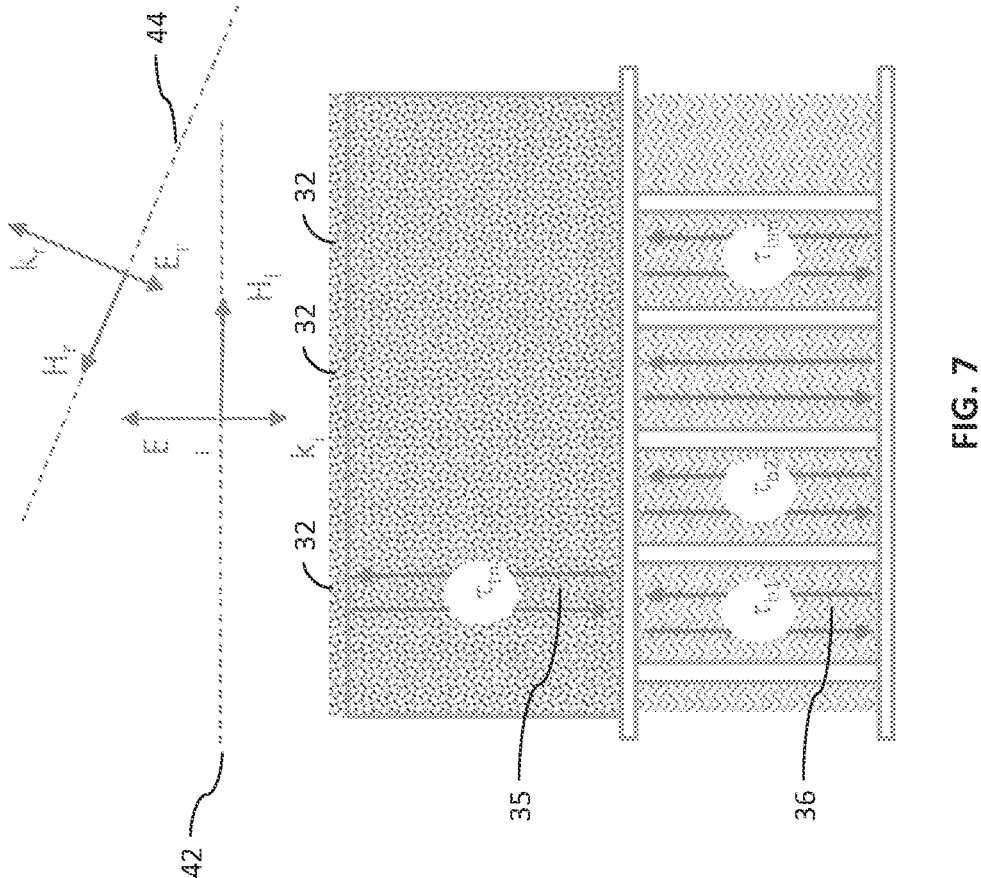

FIG. 5 depicts a cross-sectional view the disclosed two-level two-dimensional reflect-array device. In this embodiment, each of the individual optical elements comprise two optical cavities, specifically an upper and a lower cavity. Through methods we will describe and that are known to those skilled in the art, each of the cavities can independently generate a phase shift. As described in FIG. 5, FIG. 6, and FIG. 7, the upper cavities can be configured to steer the beam in the E-plane (the plane of FIG. 5, FIG. 6), while independently the lower cavities can be configured to scan the beam in the orthogonal H-plane (the plane of FIG. 7).

Figure 8:
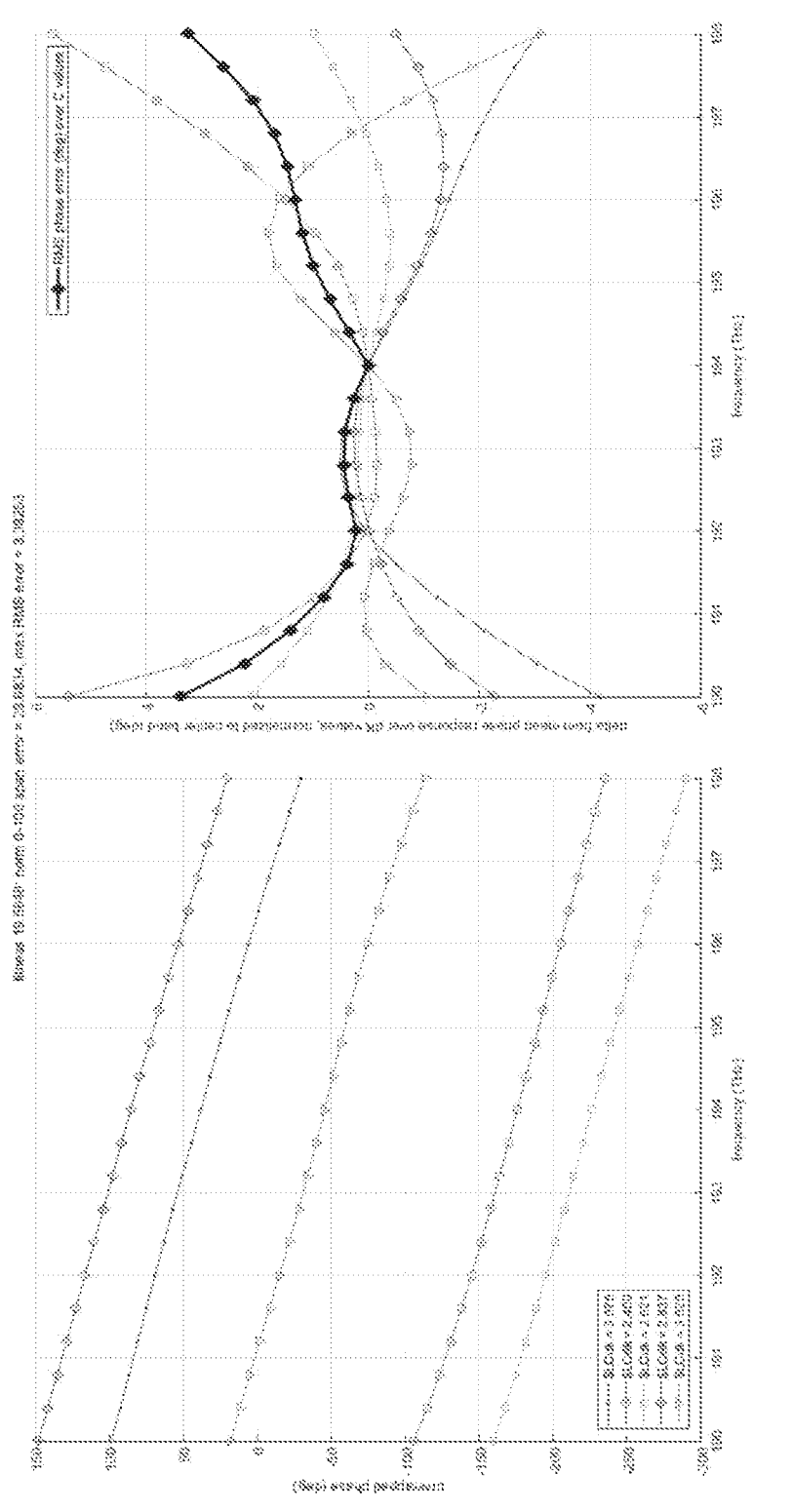
FIG. 8 depicts results of modeling the optical performance of an exemplary single optical cavity in accordance with one or more embodiments where only the electromagnetic properties of the liquid crystal material in the upper-level optical cavity are varied. The upper-level optical cavities are used to scan the re-emitted beam in the E-plane. In this case, it is assumed that the liquid crystal's dielectric constant can be varied from about 2.4 to 4.0, as is typical for available liquid crystal materials. A a beam comes from $\theta$=60 degrees and $\phi$=0 degs with the polarization in the x-z plane. Optimally, the dimensions of the structure can be chosen so that the upper-level optical cavity can provide 360-degrees of phase variability over the range of available dielectric constants. This allows the beam to be scanned with minimal phase error in the x-z or ($\phi$=0) plane which in this polarization can also be referred to as the E-plane. Further, it is desirable that the phase be stable over the operational bandwidth of the device. The left graph plots phase shift as a function of the frequency of the incident electromagnetic energy for various dielectric constants of top-layer liquid crystal material. Stability over a bandwidth implies that the performance results are stable with frequency. The right graph plots the change from mean phase response, as a function of frequency, for a range of available dielectric constants. The results compare well with more conventional methods or realizing a active scannable surface. An alternative method used as lower frequencies is with the use of pin diode phase shifters. A phase shifter might have 4 bits. In this case 360 degrees is divided into $2^4$=16 phase state. The resulting potential quantization error would then be about 360/16 or 22.5 degrees. The 7 degrees of mean phase error we see here compares well with a 4-bit phase shifter.
Figure 9:
FIG. 9 depicts the same information shown in FIG. 8 except that here the lower-level optical cavities are used to scan in the y-z plane. The results of modeling the optical performance of a single optical cavity where only the electromagnetic properties of the liquid crystal material in the lower-level optical cavity are varied. The lower-level optical cavities are used to scan the re-emitted beam in the H-plane. In this case, it is assumed that the liquid crystal's dielectric constant can be varied from about 2.4 to 4.0, as is typical for available liquid crystal materials. Optimally, the dimensions of the structure can be chosen so that the upper-level optical cavities can provide 360-degrees of phase variability over the range of available dielectric constants. Further, it is desirable that the phase be stable over the operational bandwidth of the device. The left graph plots phase shift as a function of the frequency of the incident electromagnetic energy for various dielectric constants of top-layer liquid crystal material. The right graph plots the change from mean phase response, as a function of frequency, for a range of available dielectric constants.
Figure 10:
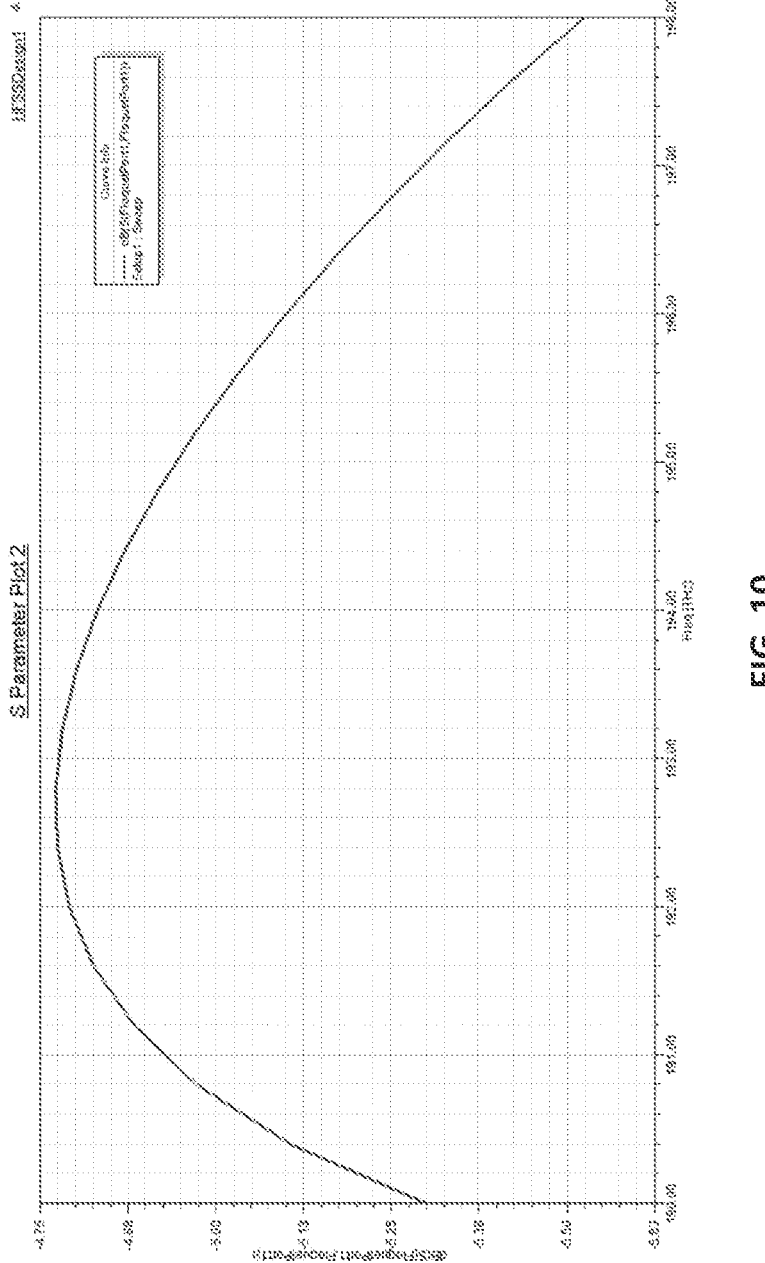
FIG. 10 depicts results of modeling the optical performance of an exemplary device in accordance with one or more embodiments. It is beneficial to operation of the disclosed device that the system have high-reflectivity, meaning that a significant portion of the incident electromagnetic energy is reemitted. The graph shows the reflectivity of the device as a function of the frequency of the incident electromagnetic energy. We would like to make the reflectivity as high as possible. We can improve the performance through the use of lower loss liquid crystal and more highly conductive materials. An ideal reflector would have no loss (0 dB). With the assumptions for the material used here we have a loss of around 5 dB providing an efficiency of around 32%.
Figure 11:
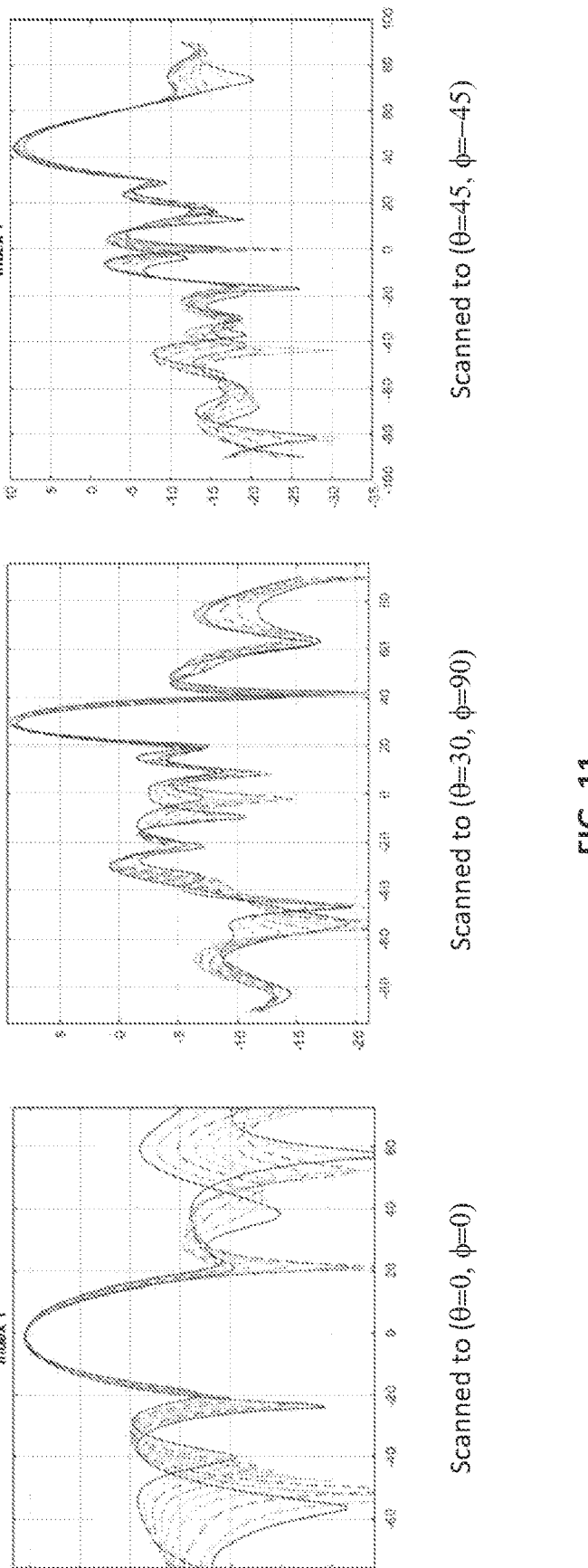
FIG. 11 depicts results of modeling the optical performance of an exemplary device in accordance with one or more embodiments. An 8×8 array of two-layer optical resonators is modeled. In practice, arrays will comprise thousands of rows and columns of optical resonarys, resulting in enhanced performance. An incident wave of electromagnetic energy impinges onto the array at an elevation of 60 degrees in the E-plane ($\theta$=−60, $\phi$=0). Each of the graphs depicts signal gain (in dB) as a function of angle from vertical in the E-plane for various angles in the H-plane in the predetermined desired direction. In the left graph, the energy is emitted vertically ($\theta$=0, $\phi$=0). A specular reflection would be at ($\theta$=60, $\phi$=0) but due to the variation on the dielectric constants of the upper layer, the beam is moved to ($\theta$=0, $\phi$=0). In the center graph, the energy is emitted in the E-plane at ($\theta$=30, $\phi$=0). This angle required that we change the dielectric constant in both the uppers to get the beam to $\theta$=0 in the $\phi$=0 and then the lower layers to scan the beam to $\theta$=30 in the $\phi$=0 plane and lower layers with the beam ending up at ($\theta$=30, $\phi$=0). Finally, in the right graph, the energy is redirected to ($\theta$=45, $\phi$=−45). As can be seen from the graphs, even a 8×8 array achieves can scan a beam over a wide range of angles. In a larger array, the beams would be much more narrow. The plot demonstrates the viability of the approach.

Numerical modeling Numerical modeling of the disclosed optical cavity shows the ability of upper cavity to generate required phase shifts (FIG. 8) and the lower cavity to generate required phase shifts (FIG. 9). FIG. 10 shows the modeled reflectivity of the unit cells as a function of wavelength. Finally, FIG. 11, shows modeling results from an 8×8 element two-level reflect array device. The results demonstrate the ability of the device to scan a beam in both the E-planes and H-plans, as intended.

Description of the Device

Figure 2:
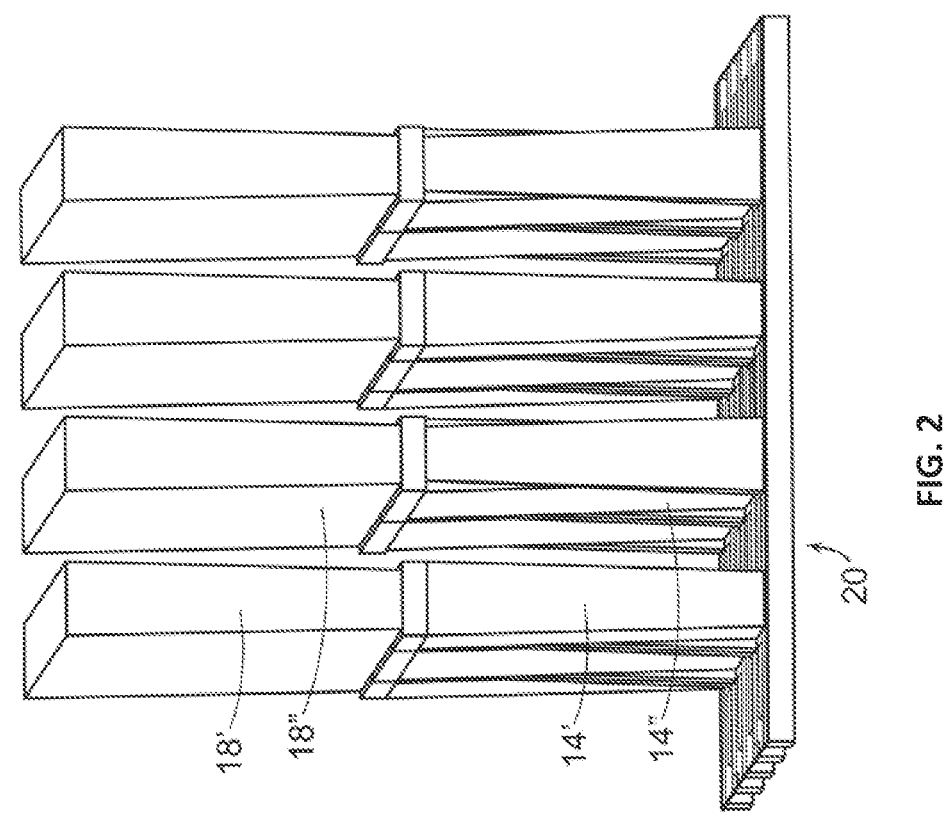
FIG. 2 illustrates the device of FIG. 1 from a side angle. Each optical element comprises an optional reflector fabricated within the copper interconnect layer 20, one half of each of two first-layer copper electrodes 14' and 14", and portions of two second layer 'bar' electrodes 18' and 18".
Figure 3:
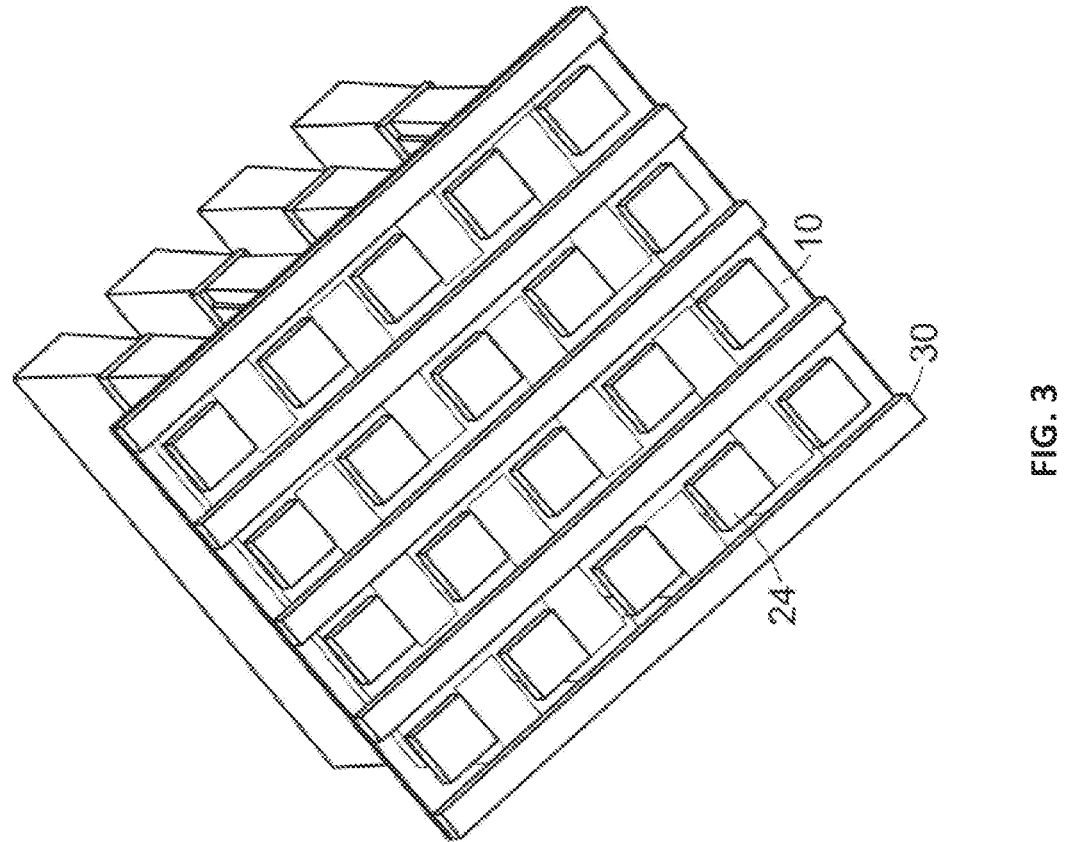
FIG. 3 illustrates a bottom view of the device shown in FIG. 1. The copper interconnect layer is depicted in more detail. In this embodiment, control lines 30 run perpendicular to the first-layer electrodes. These control lines 30 are connected to first-layer electrodes through vias (not shown) in the oxide base layer 10. The optional reflectors 24 are also shown. The space between the control lines 30 and the optional reflectors 24 is typically filled with oxide (not shown).

A more detailed design for the disclosed device is shown in FIG. 1, FIG. 2, and FIG. 3. The device comprises two layers of copper electrodes fabricated on a base. Upper-layer and lower-layer optical cavities are each bounded on two sides by at least two electrodes. They are further bounded below by a metal 'reflector' structure. The reflector may comprise a specific structure designed or that purpose. Alternately, the action of the reflector structure may be provided by other structures, for example, control lines. The orientation of the electrodes is chosen to guide light into the optical cavities, given the polarization of the incoming light, and to minimize any changes in optical impedance between the upper and lower layers. For this reason, the upper and lower electrodes are co-linear, even though they are responsible for direction of light in orthogonal directions.

The upper-level electrodes comprise continuous bars, as were featured in the cited prior art. This creates 'rows' of upper-level optical cavities. The electric field within each of the upper optical cavities is determined by the difference in the electric potential of the bounding 'bar' electrodes. Even though each electrode is shared by two optical cavities, an arbitrary one-dimensional pattern of electric fields can be generated. If one bounding electrode is set at an arbitrary electric potential, the chosen electric field can be established by setting the electric potential of the next electrode either at a higher or lower potential as required to generate the desired field. This process can continue across the device. As the upper electrodes comprise 'bars', the phase change generated by each of the upper-level cavities along a 'row' (in direction of the 'bars') is the same.

Though less obvious, the lower-level cavities are configured so that lower-level cavities in each 'column' generate the same phase shift. The lower-level electrodes are fabricated directly under the upper-layer electrodes, separated by an insulating layer. Instead of being continuous 'bars', they are broken, optionally by oxide columns, every other cavity. Further, each row of electrodes is offset from the next row by one resonator. These electrodes are fed from below through vias at the center of the electrodes. The vias connect to conductors running in 'columns', perpendicular to the upper-layer electrodes. Careful examination will reveal that this configuration causes lower-level cavities in each column to have the same differential voltage, the same electric field, and thus the same phase shift.

Description of the Method and Processes for Fabrication

A fabrication processes to fabricate and package the disclosed is shown in FIG. 14 through FIG. 45. The figures are intended to be illustrative, and do not represent actual cross sections occurring in the disclosed design. The disclosed process leverages copper dual-damascene back-end wafer processing techniques, as are known to those practiced in the art. Those skilled in the art will appreciate that a device with similar geometry and function can be fabricated using single-damascene processes as well. The device begins with a silicon wafer that may optionally contain electronic circuitry (whether connected to the device or not). A Silicon Nitride layer is deposited for electrical isolation and then a first copper damascene layer is fabricated that includes the lower conductors and (optional) reflector structures (FIG. 14 to FIG. 16). A nitride-oxide-nitride layer is deposited, and then a second copper damascene layer is fabricated containing the lower-level electrodes (FIG. 17 to FIG. 22). Another nitride-oxide-nitride layer is deposited, and then a third copper damascene layer is fabricated containing the upper-level electrodes (FIG. 18 to FIG. 28). A nitride layer is applied and patterned, and then a wire bonding pad layer is applied and patterned. (FIG. 29 to FIG. 32).

Etching of the upper-level and lower-level optical cavities is shown in FIG. 33 to FIG. 38. A photoresist layer is used as an etch mask. Nitride and Oxide (e.g. TEOS) layers are etched alternately using an anisotropic etch. Either selective or non-selective etches may be used, as long as the processes switches to a selective etch to stop on the bottom nitride layer (FIG. 35). In general, a vertical or high-aspect-ratio etch is preferred, to the extent possible. An isotropic oxide etch (such as with dilute hydrofluoric acid) is then performed and timed to remove the oxide at the base of the lower-level electrode (FIG. 36B). In FIG. 36G depicts the shape of the oxide spacers (FIG. 1A) after completion of the isotropic etch. A nitride etch then clears remnant nitride layers and an oxidation and etch are performed to remove Tantalum Nitride seed layers from the sides of the electrodes (FIG. 37 through FIG. 38). Finally, a nitride layer is deposited over the entire device to serve as an isolation layer, and openings to the wire bond pad created (FIG. 39 to FIG. 42).

The packaging of the device is shown in FIG. 43 to FIG. 45. First, an adhesive layer is applied, for example using an inkjet-like system. The adhesive contains spacers of a chosen size (FIG. 43). A glass cover plate is then applied and pressed onto the adhesive and spacers (FIG. 44). Liquid crystal material is then loaded into the cavity thereby created using techniques known to those practiced in the art (FIG. 45). Finally, the wavers of devices are diced and glued into packages (not shown). Wire bonding is used to electrically connect the devices to the package (FIG. 46).

Tiling of Devices

One aspect of devices in accordance with various embodiments relates to the tiling of multiple devices to achieve a larger aperture. Though die-stitching techniques, in which a single multi-cm-scale device is fabricated on a silicon wafer, can be used, doing so is technically challenging and subject to low manufacturing yields. Typically, the largest device that can be readily fabricated with back-end copper-damascene processes, at the 130 nm node or below, is on the order of 2 cm by 3 cm. However, in many applications, such as in satellite-to-satellite optical communication, apertures of up to 6-10 cm×6-10 cm are desirable.

Tiling of smaller devices to achieve a larger aperture can be done but must be done with consideration. The ability and method to tile devices is an important aspect of the invention. To tile the one-dimensional devices disclosed in the prior art, the rotations of all of the dice must match precisely, to within less than a wavelength over many centimeters. This can be challenging to achieve.

In various embodiments, each reflect-array device comprises two-dimensional array of optical elements. These elements are typically less than a micron across, and are fabricated on a common pitch, for example, one-third to two-thirds a wavelength. Let's assume a saw-tooth pattern of phases is desired, as show in FIG. 4. There is no requirement that the resonators be fabricated co-planar and on a common pitch across the entire aperture. Rather, to achieve the desired beam redirection, the pattern of phases generated by each optical element must match the desired saw-tooth function (or other function). If the position of a particular optical element (or array of optical elements) is offset in-plane, then the optical elements can be commanded to generate the phase shift required by the saw-tooth pattern at their actual location.

In this manner, two-dimensional scanning chips can (in principle) be arbitrarily positioned on a plane, their locations and orientations determined through a calibration procedure, and their phase patterns (directions and positional-phase in each direction) commanded to match a desired saw-tooth pattern.

For two dimensional arrays, one can also calibrate multiple dice into a single aperture even if they are not perfectly co-planar. In this case the frequency of the saw-tooth must also be adjusted.

Implementation in Beam Steering Systems

FIG. 12 and FIG. 13 depict methods of employing the disclosed device in beam steering systems. In FIG. 12, the device 60 is mounted on a substrate 62 that is optionally a rotating stage. The laser or other coherent illumination source 64 is optionally actuated and further optionally rotates with the substrate 62. Through the function of the system, the laser beam illuminates the device, and the laser beam is redirected in a desirable direction, such as towards target 70. The direction and polarization of the beam 68 can be altered by moving the laser 64, changing the cavity settings on the device 60, and/or rotating the substrate 62. Through these actions, the beam 68 can be, for example, redirected from target 70 to target 74. Each of the various control mechanisms can be employed to achieve each of various objectives, such as fine beam steering control, beam coarse steering control, polarization control of the emitted beam, alignment of polarization between laser 64 and device 60, etc.

In one embodiment, (1) the phase pattern in the device 60 is used to control coarse beam steering in two dimensions, (2) the actuation of the laser is used to control fine beam steering in two dimensions, (3) the laser is mounted on the substrate so that they rotate together, thereby keeping the polarization of light impacting the device constant, and (4) the substrate rotates so as to determine the polarization of light experienced at the target 70. This configuration has a number of advantages. First, a significant factor driving cost of optical beam steering devices is the cost of precise actuation of the large main optic, in this case the device 60. Precisely actuating large structures over large angles is difficult and expensive to achieve. As the device 60 is solid state, it achieves large-scale beam steering without the need for large-scale actuation. Further, one of the primary drivers of cost and technical challenge for holographic and optical phased array devices is the need for large numbers of control lines. Because the number of control lines scales with the number of independent scan directions, using the device for coarse steering limits the number of required control lines. By comparison to the main optic 60, the laser and laser optic assembly 64 are small and can be readily actuated precisely and at high speed and can thus be readily used for fine steering control. Maintaining orientation between the laser and the device 60 enables the polarization of light experienced by the device 60 to be kept constant, significantly simplifying the design and improving the performance of the device. Finally, rotating the whole system (device and laser) using a rotating substrate allows control over the polarization of light received at the target, improving overall link performance.

Generation of Multiple Beams

One beneficial aspect of various embodiments is the ability to generate or receive multiple beams of light simultaneously. For example, in a satellite communication system, it can be desirable to communicate with multiple satellites simultaneously using a single optical terminal. Alternately, it can be desirable to establish communication with a new satellite before breaking a connection to current satellite (a 'make-before-break' strategy).

The disclosed device is able to absorb and re-emit a beam so as to redirect a beam in an arbitrary direction. The disclosed device is also capable of being configured to generate multiple beams. For example, the upper-layer optical cavities and the lower-layer optical cavities can each be configured to split the beam into two, three or more beams by superimposing multiple saw-tooth patterns with differing spatial frequencies. Thus, a one-dimensional fan of beams, or a two-dimensional array of beams (2×2, 2×3, 3×2, 3×3, etc.) can be generated.

FIG. 12 depicts a device where the device is configured to generate a 1×2 array of beams, comprising specifically beam 68 and beam 72. In this configuration, the energy emitted from the laser 64 is split in half, with substantially half of the re-emitted energy directed at 70 and 74, respectively. If additional beams are generated, the energy of the laser 64 is further subdivided.

FIG. 13 illustrates another aspect of disclosed embodiments. In this system, two or more lasers, for example 64' and 64", are used, each of which may optionally be actuated. The action of the device 60 on the light emitted by each of the lasers 64' and 64" is the same, either, for example, redirecting the beam in into beams 68' and 68", or splitting the beams into beams 68', 68", 72' and 72". Because the lasers 64' and 64" are located at different positions, the angle between the lasers (C) and the device (A) are different, and the angle of reemission of beams 68' and 68" are different. In one implementation, the re-emitted beam 68' is directed to target (F) and the re-emitted beam 72" is directed at target 74. Re-emitted beams 68" and 72' are lost to space. In one embodiment, the device 60 provides coarse steering control for the two beams, and the actuation of the lasers 64' and 64" provides fine steering control.

For the application of communications, for example, satellite-to-satellite communication, there are several approaches to achieving communication between two satellites using a single terminal, such as those in FIG. 12 and FIG. 13. Each of the approaches requires some form of multiplexing. In each case, energy generated by lasers is distributed among the targets differently, and different amount of energy are lost.

In a first embodiment for multi-device communication, multiple terminals are used, for example, one for each intended communications link (satellite). Each system would interact independently with their respective satellites. Using this approach, the disclosed system would provide advantages in terms of size, weight, cost, momentum-free operation, and slew rate over existing telescope-based systems. In a power-aperture constrained environment, the wall-plug power would be divided among the various systems, thereby decreasing the available bandwidth on each link. The total amount of aperture would be the sum of the apertures for the various devices, but because each of the various systems do not coherently combine their respective apertures with each other, these apertures do not have the effect of combining to improve overall system bandwidth.

In a second embodiment for multi-device communication, a single terminal is steered rapidly between two target locations. This approach is not achievable with optical communications systems using large movable optics because of their slow mechanical steering rate. Because the disclosed device can slew between any two directions very rapidly, effective near-simultaneous communication between multiple destinations (satellites) would be achievable. In this embodiment, each channel would enjoy the full optical power from the laser and the full gain provided by the device, and thus utilize the entire available data-rate. However, because the beam is only directed in one direction at a time, the available bandwidth is shared among the various directions/channels.

In a third embodiment for multi-device communication, a single laser beam is split and directed towards multiple satellites. This embodiment is depicted in FIG. 12. Here, the optical energy is split among the various directions. In a power-aperture limited communications environment, this decreases the optical power available for each channel, and thus the bandwidth achievable. Thus, the bandwidth is effectively shared among the multiple channels. Discounting the time needed to steer the beam, embodiment achieves a similar bandwidth to the first embodiment. The data rate for each channel is decreased, but the connect time for each channel is increased.

In a fourth embodiment for multi-device communication, multiple source laser beams are generated by multiple source lasers. This embodiment is depicted in FIG. 13. The light from multiple independent lasers (e.g. n) is directed at the device 60. Each of the beams from each of the lasers is then split n ways, such that one beam from each of the lasers impinges on one of the intended targets. In a power-aperture constrained environment the total available (wall-plug) power would be distributed be distributed among the various lasers, thereby decreasing the channel bandwidth for each of the lasers. Further, the energy from each of the lasers would be split among each of the resulting beams, again, further decreasing the available bandwidth.

In the device disclosed above the upper and lower scanning layers provide scanning in orthogonal dimensions, for example, azimuth and elevation. One skilled in the art will recognize that by appropriate rotation of the bottom interconnect layer, and appropriate elongation of the electrodes in the lower optical cavity, the scanning action of the upper and lower layers can be non-orthogonal. In the extreme, the electrodes for the upper and lower scanning layers become paralleled, with both levels comprising continuous bar electrodes. In this limit case, both the upper and lower scanning layers provide scanning control in dimensions that are parallel. This could be useful, for example, to provide independent fine and coarse steering control using, for example, the upper layer for coarse direction control and the lower layer for fine direction control.

One skilled in the art will appreciate that the disclosed beam steering device can be employed in any of a number of applications, including without limitation, communication from a space satellite to another space satellite, communication from a space satellite to a station on the ground, communication from a space satellite to an aircraft, communication from a space satellite to a boat, communication from one component or element within a computer or computer network to another component or element within the same or differing computer or computer network, communication to or from a personal electronic device, and communication to or from an automobile.

If incorporated a component in a LIDAR, the system, without limitation, may be employed to track the position of or enable the navigation of space vehicles, airborne vehicles, marine vehicles, individual people or animals, and ground vehicles including automobiles. It may also be employed to map the earth or other celestial body.

If incorporated a component in an energy transfer system, the system, without limitation, may provide power for space vehicles, airborne vehicles, marine vehicles, ground vehicles including automobiles, devices worn or held by individual people or animals, sensors, and components with a computer or computer network. The energy transfer system may also be operated with the intention of disrupting the beneficial operation of another system, for example, by destroying it or rendering it interoperable.

EXAMPLES

An optical beam steering device in accordance with one or more embodiments comprises at least two actuation layers, wherein the action of the first layer is to steer the beam in a first scanning dimension, and the action of the second layer is to steer the beam in a second scanning dimension. In one or more embodiments, the at least two scanning layers provide at least two scanning dimensions, and where said scanning dimensions are oriented orthogonal to one other. In one or more embodiments, at least one scanning layer provides control over scanning in elevation. In one or more embodiments, at least one scanning layer provides control over scanning in azimuth. In one or more embodiments, the at least two scanning layers provide at least two scanning dimensions, and where at least two of said scanning dimensions are oriented parallel to one other. In one or more embodiments, the two parallel scanning dimensions provide coarse and fine scanning control. In one or more embodiments, the scanning control is achieved by applying an electric field to liquid crystal material. In one or more embodiments, the device is constructed using at least one layer fabricated using copper-damascene microfabrication techniques. An optical communication system in accordance with one or more embodiments comprises at least one optical beam steering device comprising at least two actuation layers. In one or more embodiments, the communication system is utilized for communication from or to a satellite in space. In one or more embodiments, the communication system is utilized for communication from or to a computer. In one or more embodiments, the communication system is utilized for communication from or to a personal electronic device. In one or more embodiments, the communication system is utilized for communication from or to an automobile.

A LIDAR system in accordance with one or more embodiments comprises at least one optical beam steering device comprising at least two actuation layers. In one or more embodiments, the LIDAR system is used to track the position of objects in space. In one or more embodiments, the LIDAR system is mounted on an object in space. In one or more embodiments, the LIDAR system is mounted on an aerial vehicle. In one or more embodiments, the LIDAR system is mounted on a maritime vehicle. In one or more embodiments, the LIDAR system is mounted on a land vehicle, including an automobile. In one or more embodiments, the LIDAR system is mounted on personal electronic device. In one or more embodiments, the LIDAR system is configured so as to be wearable by a person.

A display system in accordance with one or more embodiments comprises at least one optical beam steering device comprising at least two actuation layers. In one or more embodiments, the display system is mounted on a land vehicle, e.g., an automobile. In one or more embodiments, the display system is mounted on personal electronic device. In one or more embodiments, the display system is configured so as to be wearable by a person.

An energy transfer system in accordance with one or more embodiments comprises at least one optical beam steering device comprising at least two actuation layers.

A directed energy system in accordance with one or more embodiments comprises at least optical beam steering device comprising at least two actuation layers.

A fabrication process in accordance with one or more embodiments is disclosed for realizing an optical beam steering device comprising at least two actuation layers. In accordance with one or more embodiments, the process includes at least one layer fabricated using copper-damascene microfabrication techniques. In one or more embodiments, the process utilizes one or more anisotropic oxide etch steps, followed by at least one isotropic oxide etch step, to form cavities for the liquid crystal material.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

The invention claimed is:

1. An optical beam steering device comprising at least two scanning actuation layers, wherein the action of the first layer is to steer the beam in a first scanning dimension, and the action of the second layer is to steer the beam in a second scanning dimension, the device further comprising a liquid crystal material and wherein scanning control is achieved by applying an electric field to the liquid crystal material, the device comprising a lower layer and an upper layer, wherein the first layer is the lower layer of the device and the second layer is the upper layer of the device, the upper layer comprising a plurality of upper electrodes that at least partially define a plurality of upper optical cavities, the lower layer comprising a plurality of lower electrodes that at least partially define a plurality of lower optical cavities, wherein at least one cavity of the plurality of the upper cavities and at least one cavity of the plurality of lower cavities contain the liquid crystal material, the device further comprising an interconnect layer that is electrically connected to at least some electrodes of the plurality of lower electrodes.

2. The device of claim 1 wherein the at least two scanning actuation layers provide at least two scanning dimensions, and where said scanning dimensions are oriented orthogonal to each other.

3. The device of claim 1 wherein at least one scanning actuation layer provides control over scanning in elevation.

4. The device of claim 1 wherein at least one scanning actuation layer provides control over scanning in azimuth.

5. The device of claim 1 wherein the at least two scanning actuation layers provide at least two scanning dimensions, and where at least two of said scanning dimensions are oriented parallel to each other.

6. The device of claim 5 wherein the two parallel scanning dimensions provide coarse and fine scanning control.

7. The device of claim 1 constructed using at least one layer fabricated using copper-damascene microfabrication techniques.

8. The device of claim 1, wherein at least some electrodes of the plurality of the upper electrodes are arranged as common bar electrodes.

9. The device of claim 1, wherein at least some electrodes of the plurality of lower electrodes are arranged in a plurality of rows, the device further comprising a plurality of separators, wherein for each row of the lower electrodes, at least some separators of the plurality of separators electrically isolate lower electrodes from each other.

10. The device of claim 1, wherein the plurality of separators comprises oxide separators.

11. The device of claim 1, wherein each row of the lower electrodes is offset from the next row of the lower electrodes in an alternating manner.

12. The device of claim 1, further comprising an isolation layer configured to electrically isolate at least some of the electrodes of the plurality of lower electrodes from at least some electrodes of the plurality of upper electrodes.

13. The device of claim 1, further comprising a plurality of vias disposed between the interconnect layer and the plurality of lower electrodes, wherein the interconnect layer comprises a plurality of control lines, wherein at least some control lines of the plurality of control lines connect to at least some electrodes of the plurality of lower electrodes through at least some vias of the plurality of vias.

14. The device of claim 1, wherein at least some control lines of the plurality of control lines are disposed perpendicular to at least some electrodes of the plurality of the lower electrodes.

15. The device of claim 1, wherein the interconnect layer comprises a plurality of optical reflectors.

16. The device of claim 1, wherein at least some of the plurality of control lines are arranged as optical reflectors.

17. An optical beam steering device, comprising: at least a first scanning actuation layer and a second scanning actuation layer, wherein the first scanning actuation layer is configured to steer the optical beam in a first scanning dimension, and the second scanning actuation layer is configured to steer the optical beam in a second scanning dimension, the device further comprising a liquid crystal material adapted to actuate scanning under a control of an applied electric field, the device comprising a lower layer and an upper layer, wherein the first scanning actuation layer is the lower layer of the device and the second scanning actuation layer is the upper layer of the device, the upper layer comprising a plurality of upper electrodes that at least partially define a plurality of upper optical cavities, the lower layer comprising a plurality of lower electrodes that at least partially define a plurality of lower optical cavities, wherein the plurality of upper cavities and the plurality of lower cavities contain the liquid crystal material, wherein at least some electrodes of the plurality of lower electrodes are arranged in a plurality of rows, the device further comprising a plurality of separators, wherein for each row of the lower electrodes, at least some separators of the plurality of separators electrically isolate the lower electrodes from each other, the device further comprising an interconnect layer that is electrically connected to at least some electrodes of the plurality of lower electrodes.

18. The device of claim 17, wherein the plurality of separators comprises oxide separators.

19. The device of claim 17, wherein each row of the lower electrodes is offset from the next row of the lower electrodes in an alternating manner.

20. The device of claim 17, further comprising a plurality of vias disposed between the interconnect layer and the plurality of lower electrodes, wherein the interconnect layer comprises a plurality of control lines, wherein at least some control lines of the plurality of control lines connect to at least some electrodes of the plurality of lower electrodes through at least some vias of the plurality of vias.

21. The device of claim 17, wherein at least some control lines of the plurality of control lines are disposed perpendicular to at least some electrodes of the plurality of lower electrodes.

22. The device of claim 17, wherein the interconnect layer comprises a plurality of optical reflectors.

23. The device of claim 17, wherein at least some control lines of the plurality of the control lines are arranged as optical reflectors.

24. The device of claim 17, wherein the upper electrodes are arranged as common bar electrodes.

* * * * *